United States Patent [19]

Sutherland

[11] Patent Number: 4,837,740

[45] Date of Patent: Jun. 6, 1989

[54] ASYNCHRONOUS FIRST-IN-FIRST-OUT REGISTER STRUCTURE

[76] Inventor: Ivan F. Sutherland, 1035 Devon Rd., Pittsburgh, Pa. 15213

[21] Appl. No.: 118,997

[22] Filed: Nov. 10, 1987

Related U.S. Application Data

[63] Continuation of Ser. No. 688,848, Jan. 4, 1985, abandoned.

[51] Int. Cl.⁴ .................. G06F 13/00; G21K 5/08
[52] U.S. Cl. .......................... 364/900; 377/66
[58] Field of Search ... 364/200 MS File, 900 MS File; 365/73, 77, 78, 221; 377/66, 77, 81

[56] References Cited

U.S. PATENT DOCUMENTS

| | | | |
|---|---|---|---|
| 3,051,929 | 8/1962 | Smith | 364/900 |
| 3,212,009 | 10/1965 | Parker | 328/37 |
| 3,300,724 | 1/1967 | Cutaia | 328/37 |
| 3,510,680 | 5/1970 | Cogar | 307/221 |
| 3,623,020 | 11/1971 | Mao | 364/900 |
| 3,727,204 | 4/1973 | deKoe | 364/900 |
| 3,757,231 | 9/1973 | Faustini | 328/221 |
| 3,838,345 | 9/1974 | Schneider | 365/78 |
| 3,953,838 | 4/1976 | Gilberg et al. | 365/78 |
| 4,058,773 | 11/1977 | Clark et al. | 377/66 |
| 4,090,256 | 5/1978 | Hepworth et al. | 365/78 |
| 4,156,288 | 5/1979 | Spandorfer | 365/78 |
| 4,423,482 | 12/1983 | Hargrove et al. | 364/200 |
| 4,679,213 | 7/1987 | Sutherland | 377/66 |
| 4,785,204 | 11/1988 | Terada et al. | 377/81 X |

Primary Examiner—Raulfe B. Zache
Assistant Examiner—Florin Munteanu
Attorney, Agent, or Firm—Nilsson, Robbins, Dalgarn, Berliner, Carson & Wurst

[57] ABSTRACT

An asynchronous FIFO incorporates a series of interconnected cells alternately oppositely inverted to provide forward and retrograde data paths, so as to selectively establish virtual flip flops as needed at interfaces between cells. Each cell combines an inverting amplifier for data, switch structure and a binary control for the switch structure to provide the data path. The controls are interconnected in a sequence along with logic to set the state of each control according to an instruction: copy the state of your predecessor in the sequence if the states of your predecessor and successor differ, otherwise hold your present state.

24 Claims, 11 Drawing Sheets

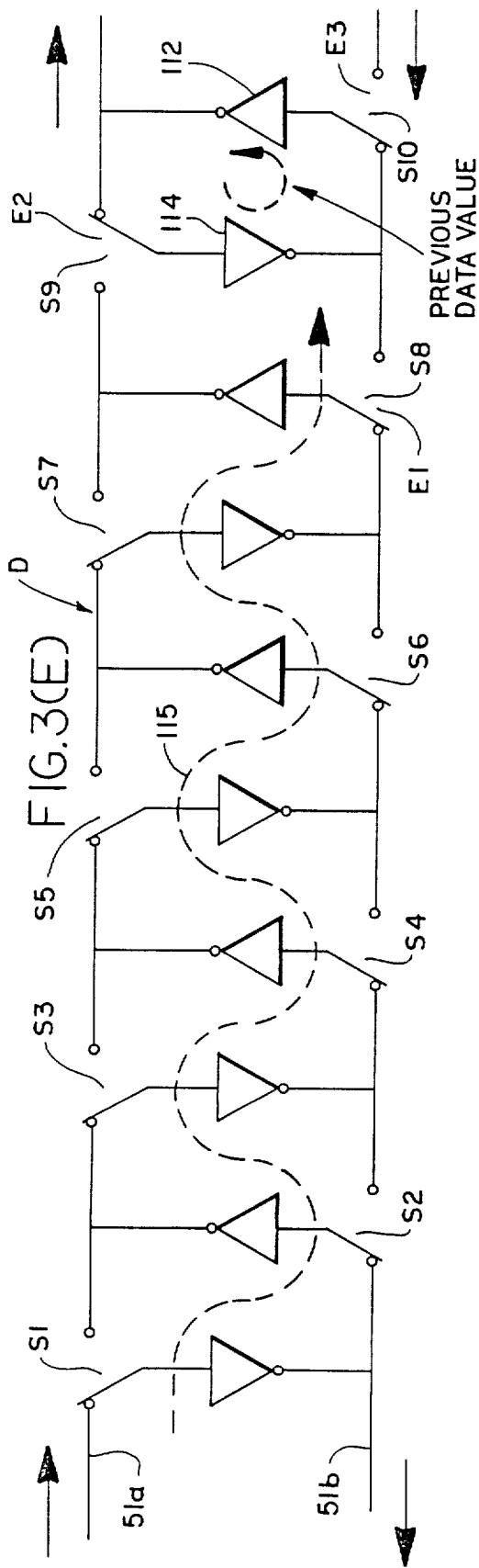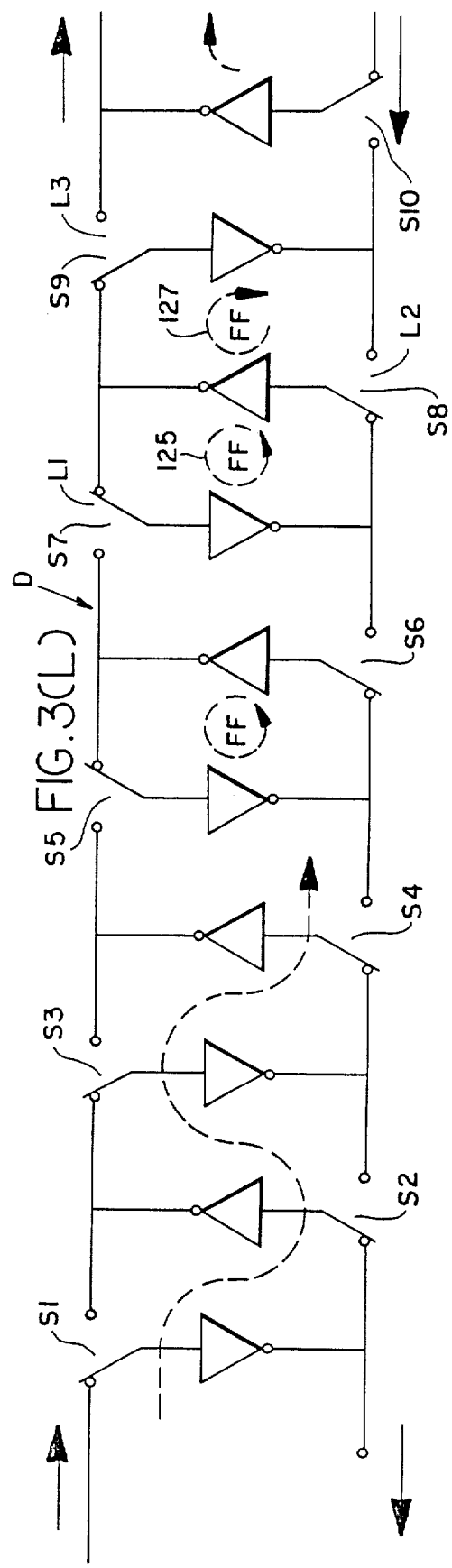

ASYNCHRONOUS FIRST-IN-FIRST-OUT REGISTER STRUCTURE

This is a continuation, of Application Ser. No. 688,848, filed Jan. 4, 1985, not abandoned.

BACKGROUND OF THE INVENTION

This invention relates to the general area of first-in-first-out (FIFO) register sets as used in the computing field to communicate between apparatus operating at different rates. More particularly it relates to asynchronous FIFOs in which data signals are transferred bidirectionally inside the FIFO without regard to system clocks, but rather at a speed determined entirely by the speed of the circuitry within the FIFO. The asynchronous design of the FIFO permits it to operate at the maximum speed of which its circuitry is capable.

In a broad sense, first-in-first-out storage systems are familiar in a wide variety of applications. In manufacturing production lines, for example, FIFO storage holds work-in-process to provide a buffer between two operating stations on the line, allowing the stations to function somewhat independently.

In computing equipment, electronic digital first-in-first-out storage systems serve in a similar capacity. Just as in a production line, these electronic units, called FIFOs, buffer independent processes. A FIFO stores the output from one process until a subsequent processor is ready for it. The first-in-first-out nature of FIFO storage systems ensures that the subsequent processor receives the data elements in the same order that they were generated, though not necessarily on the same time schedule.

FIFO storage systems are used in computers, just as they are used in production line manufacturing processes, to provide time independence between the processing operations preceding and following the FIFO. The FIFO decouples the processor before it from the one after it. Accordingly, it can deliver data to a later processor even if the earlier process has temporarily halted. Similarly, a FIFO can hold the output from a preceding processor while a later processor is temporarily unable to accept input.

If two computing processors operate in pipeline fashion at different instantaneous rates, a FIFO is required between them. Data from one processor, e.g. the head of a magnetic storage disk, will enter the FIFO at a rate determined by the source process. Specifically, data from the storage disk will enter the FIFO at a rate set by the rotation rate of the disk and the bit density of the data storage on the disk. Also, the data flow will be interrupted periodically by inter-record gaps. Normally, the data will be delivered to another processor, e.g. a computer, at a rate suitable for its operation. The FIFO serves as a buffer between the two processors. It permits each of the processors to deliver or obtain data at a rate convenient to it, without regard to the instantaneous speed or timing of the other processor. Thus, a FIFO couples two processors with regard to work flow, but decouples their timing.

Clocking within a traditional FIFO can be a complex matter. Most computing systems are built with clocked logic. Each step in the process proceeds according to the beat of the clock; identical clock signals are delivered to all parts of the system, just as an identical drum beat is delivered to all men in a marching column. Within the purview of the prior art, it is relatively simple to build FIFOs for use between two processors if both use the same clock. In the same context, it is a more difficult problem to build a FIFO suitable for use between two processors with independent clocks. Such a FIFO must accommodate not only irregularities in the availability of data, but also the differences in the basic clocking systems. Thus, in traditional FIFOs the form of clock used within a FIFO is an important design factor.

The nature of the clock used within some conventional FIFOs is critical to performance. Some prior hardware FIFO systems, and essentially all prior FIFOs implemented in software, operate internally in a synchronous manner. That is, in the case of hardware, timing is dictated by the beat of the clock. In the case of software, timing is at the pace of the instructions executed.

While synchronous FIFOs are most suitable for coupling processors that share a common clock, other systems are not so well handled and demand asynchronous operation. Accordingly, different parts of the FIFO must perform their operations whenever local conditions permit.

This invention involves an asynchronous FIFO in which each part of the FIFO operates independently. Because of its asynchronous design, the FIFO of the present invention can be used to couple processors with a common clock or processors that operate independently with respect to time. The system is particularly suitable for coupling asynchronous units that are able to make use of the asynchronous protocol described here which is available at both the input and the output of the FIFO.

Generally, in an asynchronous sequential FIFO, data elements enter an input port and move sequentially and asynchronously through an array of data cells to an output port from which they emerge in the same order as they entered. Each element moves forward as far and as fast as it can, with due regard to avoiding destruction of the data element ahead of it in the sequence. An asynchronous sequential FIFO is distinguished from a synchronous sequential FIFO by the fact that different data elements move at different times, and not in synchrony with a common clock. The control element for each data cell in an asynchronous sequential FIFO need consider only the state of its predecessor and successor cells and can remain ignorant of other global conditions.

The local control of the elements in an asynchronous sequential FIFO is well suited to modern integrated circuit implementations, for in such a design, signal wires can be as short as the separation of adjacent data cells and will therefore have much lower electrical capacity than would longer wires. The short wires permit the data cells to consume very low power and still operate at high speed. Local control is also advantageous in large systems where the delivery of a clock signal to many independent cells is difficult and clock "skew" is a problem.

Two kinds of local control can be used in asynchronous sequential systems. According to one kind of control, the same wires that carry data signals from one cell to the next also carry control information. Such mechanisms are usually designed for systems that carry data elements each of which contains only a single bit. Such a one-bit asynchronous sequential system with data and control carried on the same wires is called a "QUEUE".

QUEUEs can also be designed to carry multiple bit data elements, but substantially more logic is required.

In the other kind of asynchronous sequential system, the data moves through its data cells under control of a separate control mechanism. In these systems, more generally called FIFOs rather than QUEUEs, one or more control wires, generally two, are placed in parallel with the data wires. The control wires carry signals indicating whether data can move into the next successive data location, and whether it actually has moved. The present disclosed embodiment is an asynchronous sequential FIFO with control signals separate from data signals.

Asynchronous sequential FIFOs with separate control and data generally consist of two main parts. The first part is a data unit that contains a sequence of identical data cells. The data cells pass data from cell to cell en route from the FIFO input to output. The second part of such a FIFO is a control unit that contains a sequence of identical control elements that control the actions of the data cells. Each control element controls one or more data cells. Asynchronous sequential FIFOs are distinguished by the form and interconnections of their data cells and by the form and interconnections of their control elements. Because the data unit and the control unit normally are composed of a sequence of identical cells or elements respectively, one might describe a FIFO by describing the properties of a single data cell, the properties of a single control element, and the connections between them.

The data paths used in traditional FIFO systems share three characteristics. First, each data register is a distinct entity. Usually each such register is composed of two inverters or two inverting logic gates connected back to back so as to form a flip-flop of the kind in common use and familiar to those skilled in the art. Each of the gates in the flip flop is always associated with the other; the two gates are joined irrevocably as a pair defining a flip flop.

The second common characteristic of traditional FIFOs is that all data cells are connected to their respective control elements in the same way. Thus, except for their order within the FIFO, all data cells are interchangeable in a logical sense.

A third common characteristic of traditional FIFOs is that any given control signal must go through a complete cycle of two transitions for each step in the operation of the FIFO. Thus, for example, in known FIFOs, data moves forward into a particular stage only during the period when its control signal is in one logical state, say the TRUE state. Thus, to move a datum requires that the control system cycle from FALSE to TRUE and back to FALSE again, which requires two logical transitions of the control element.

SUMMARY OF THE INVENTION

The system of the present invention is distinguished from such FIFOs by improved aspects with regard to each of these three characteristics, or any combination of them.

A distinguishing feature of the present system is that the inverters or logic gates that comprise its dynamic data cells can each be involved with more than one other data cell to form only as many flip flops at a given time as are required by the current data actually stored in the FIFO. Those data cells not forming flip flops serve as a rapid transmission system defining no flip flops. Retrograde data paths between adjacent cells make this multiple use of data cells possible.

In traditional asynchronous sequential FIFOs, each logic gate or inverter is paired with a unique other gate or inverter to form a conventional flip flop to serve as one of the data cells. The data cells of the instant FIFO, on the other hand, are paired in different ways at different times to register data. They can be connected in groups of two or more to collectively store data. If the FIFO is empty, all of its data cells are connected together in strings that define no flip flops or storage at all. When the FIFO is empty, these storage-free strings of data cells transmit the data signals directly and as rapidly as possible from the input port to the output port. Accordingly, data is captured in the data unit of the instant FIFO by rearrangement of the data cells into different flip flop combinations rather than by the transfer of data from one fixed flip flop or storage element to another as in traditional systems.

Another distinguishing feature of the instant invention is that data cells are connected to control elements in more than one way. In one embodiment of the invention, data cells are connected to the control elements in both the true and complement senses thus permitting a single action of an individual control element to cause different actions in different data cells. In another embodiment of the instant invention, the connection is such that two sets of data cells are served by each control element, and behave in exactly complementary ways. Other connections involve sequences or sets of data cells in which three or more cells (one or more from each sequence) are served by a more complex control element. Such systems may enable more rapid transmission of data, bidirectional transmission of data, lower power operation, simplicity of design, or combinations of such benefits.

Another distinguishing feature of the asynchronous sequential FIFO described herein is that it can accept a new datum for each transition of the input signaling system rather than only for each cycle of the input signaling system. Similarly, the asynchronous sequential FIFO described can deliver a new datum for each transition of the output signaling system rather than only for each cycle of the output signaling system. While a transition of the signaling system involves a single change in a binary state from TRUE to FALSE or from FALSE to TRUE; a cycle requires two transitions, e.g. from TRUE to FALSE and from FALSE to TRUE or the reverse. Because the instant FIFO requires only a single transition to capture or deliver data (rather than a full cycle as have conventional systems) the instant FIFO can achieve twice the data rates of traditional FIFO systems. In an embodiment of the instant invention, this higher speed results from the arrangement of the data cells.

DESCRIPTION OF THE PREPARED EMBODIMENT

Figure 1:
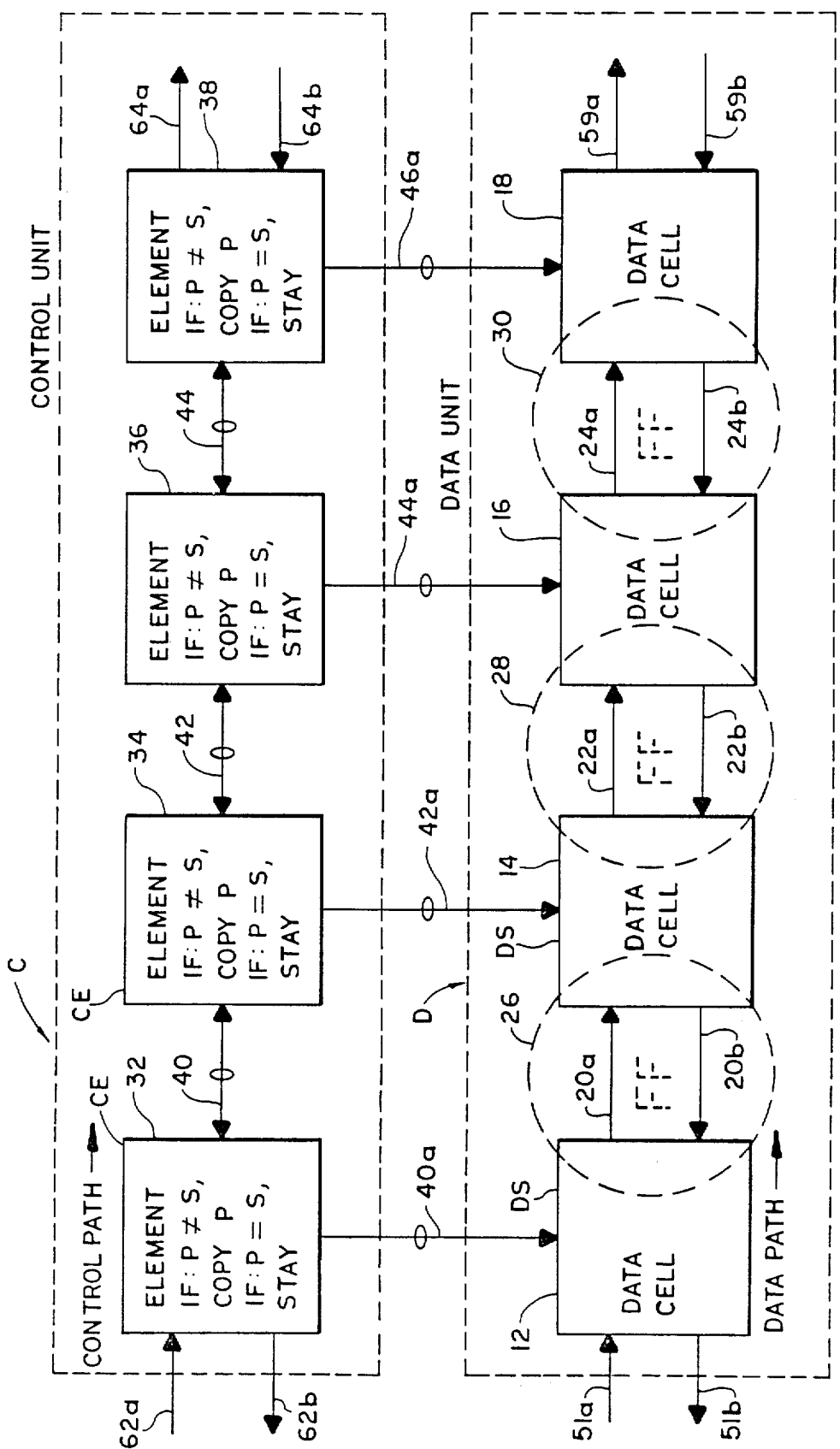
FIG. 1 is a block diagram of an embodiment of the instant invention.

FIG. 1 illustrates a FIFO built in accordance with the present invention. A control unit C (top) is operatively coupled to a data unit D (bottom) each showing a few representative stages. The data unit D is composed of a series of data cells DS and the control unit C is composed of a series of control elements CE as described in detail below.

Essentially, data bits move through the data unit D under control of signals from the control unit C. Each element CE of the control unit C has two binary states. Individual elements of the control unit utilize a uniform philosophy of operation. Specifically, each control element C follows an operating rule: if the preceding element is in a binary state different from the succeeding element assume the state of the preceding element, otherwise remain as set. The control states generated by that philosophy of operation then reflect from the control unit C to control the data cells DS in the data unit D and thereby define flip flops (binary devices) as are necessary and appropriate to register data in accordance with the instant demand on the FIFO.

Note that each data cell is dynamic, including only an amplifier but no storage. Data cells can be connected in pairs to create flip flops based on interrelated electrical signals when required. While the illustrated system is for data words of only a single bit, simple expansion can accommodate data words consisting of several bits by replication of the data unit D to handle the additional bits. The data unit D also can be replicated, as explained below, to handle data more rapidly.

As illustrated, the data unit D contains four data cells DS specifically designated as cells 12, 14, 16, and 18. Longer strings of cells are, of course, possible. Each cell is interconnected for two-way data communication with both its predecessor and successor cells. For example, cells 12 and 14 are interconnected for bidirectional data signal flow as illustrated by the arrowed lines 20a and 20b. Similarly, the lines 22a and 22b along with 24a and 24b respectively interconnect the cells 14 to 16 and 16 to 18. In previously known asynchronous sequential FIFOs, data is transmitted in the forward direction only.

It is to be understood, of course, that means other than a pair of wires as represented by the lines, e.g. lines 22a and 22b, could be used to communicate data bidirectionally. A system using complex voltage and current signaling on a single wire or frequency multiplexed signals in an optical fiber represent a few of the several alternatives. Also, other than electrical or light signal structures could be employed.

Note that, as will be explained in detail below, the bidirectional communication between individual data cells DS in the data unit D obviates the need for any one single data cell to remember (lastingly register) the value of the datum stored in the FIFO. Rather, active data cells combine to define binary storage. Consequently, the construction of the data cell DS is simplified.

As illustrated in FIG. 1 by dashed-line circles 26, 28, and 30 (designated with symbols FF), each pair of adjacent data cells may cooperate as a virtual flip flop to store a bit of data. That is, when operating as a flip flop, pairs of cells cooperate, then each receives and reflects the data it shares with its neighbor. Thus, a local storage element is formed as indicated by the dashed-line circles 26, 28, and 30.

Note that while flip flops 26, 28, and 30 are represented, each is only a possibility. In that regard, a data unit may define a flip flop with either its predecessor or successor, but not both at the same time. In operation, such virtual flip flops either hold or pass data depending on the contents of the FIFO. A digit placed in the empty FIFO propagates to the last definable virtual flip flop. Others follow, ready to exit in sequence.

The movement of data signals through the data cells 12, 14, 16 and 18 (independent of any clock timing) is accomplished by the control unit C. Specifically, intercoupled control elements CE, specifically designated as elements 32, 34, 36, and 38 in the unit C control signal movements in the data unit D.

The control elements 32, 34, 36, and 38 are connected in a chain configuration by bidirectional lines 40, 42, and 44 respectively. Also, each of the control elements 32, 34, 36, and 38 is connected to one of the data cells 12, 14, 16, and 18 respectively as indicated by lines 40a, 42a, 44a, and 46a.

Preliminary to considering further detailed operation of the system of FIG. 1, some understanding of the components will be helpful. The detailed structure of the data cells 12, 14, 16, and 18 may best be understood by reference to FIG. 9, which is a schematic diagram of an exemplary single data cell DS. In FIG. 1, such single cells are connected in a sequence from input lines 51a and 51b to output lines 59a and 59b.

The essence of the exemplary data cell (FIG. 9) is an inverter 50 having an input connected to a single-pole double-throw switch 52 controlled by a control element CE (as in the control unit C). The inverter 50 may receive signals from either of a pair of opposing lines 54 or 56 (depending on the state of the switch 52) for application both to a forward line 58 and a return line 60.

Figure 9:
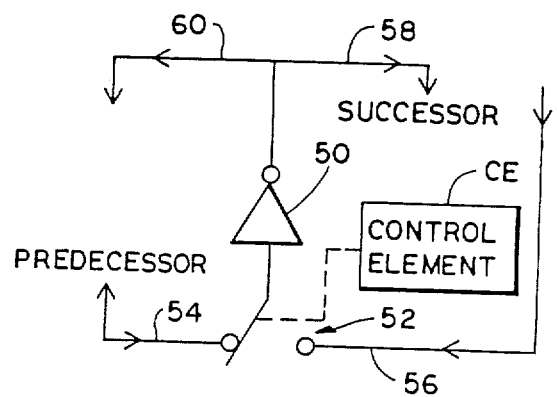

Under direction of its respective control element CE (FIG. 1) each data cell DS, as illustrated in FIG. 9, performs one of two functions. Relating to the structure of FIG. 9, the data cell has its switch 52 set by its associated control element CE. Accordingly, one function of the data cell is to examine the value delivered to it by its predecessor data cell, and retransmit that value both back to its predecessor and forward to its successor. The alternative function of the data cell (opposed switch position) is to examine the value delivered to it by its successor data cell, and retransmit that value both back to its predecessor and forward to its successor. These functions in a binary format are apparent from the structure of FIG. 9.

When data cell 16 in FIG. 1 performs the first function (under direction of its control element 36) it takes whatever data value (e.g. binary level) it receives from its predecessor 14 (on wire 22a) and retransmits that value both back to its predecessor 14 (on wire 22b) and on to its successor 18 (on wire 24a).

When the data cell 16 performs the alternate second function, it takes whatever data value it receives from its successor 18 (on wire 24b) and retransmits that value both back to its predecessor 14 (on wire 22b) and on to its successor 18 (on wire 24a).

Notice that in both modes of operation, or functions, the data cell 16 transmits identical data both forward along the wire 24a and backward along the wire 22b. The difference between the two cases is in the selection of which of the two possible inputs to use. Accordingly, the state of the switch 52 (FIG. 9) determines whether the successor or predecessor data cell DS provides the input. That is, referring to FIG. 9, data is received either from the predecessor cell through line 54 or from the successor cell through line 56. In that fashion, each cell receives data from one of its two inputs (e.g. lines 54 or 56, FIG. 9) and transmits that data on both of its outputs (e.g. lines 58 and 60, FIG. 9). Thus, the symmetrical data cells are individually instructed by the control elements CE as to which data input to select by the setting of the switch 52. In effect, each associated control element CE sets the switch.

It will be clear to one skilled in the art that if each of two adjacent dynamic cells (including an active element as an amplifier, specifically here in the form of the inverter 50) examines the data sent to it from the other, and returns the same value to the other cell, a storage element is created. Accordingly, the flip flops 26, 28, and 30 are possible. These storage or flip flop elements, however, are not fixed in space, for each data cell DS in the FIFO as shown in FIG. 1 can participate in either of two such possible storage elements FF, depending on whether it is paired with its predecessor cell or its successor cell as indicated in FIG. 1 by the flip flops 26, 28, and 30. Thus, the data cells are symmetrical, being able to pair or couple in either direction. The number and disposition of the active storage elements FF at any instant in the asynchronous sequential FIFO described here can change from time to time to suit both the amount of data and the location of the data contained therein.

Figure 10:
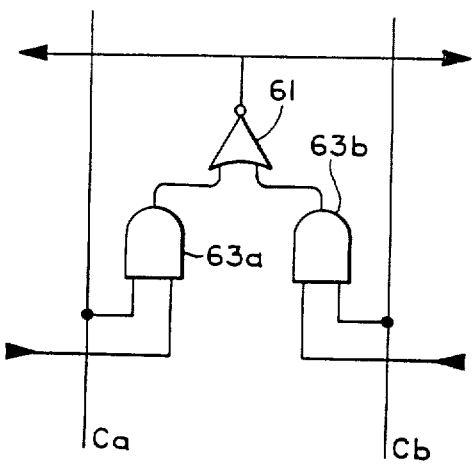
Figure 11:
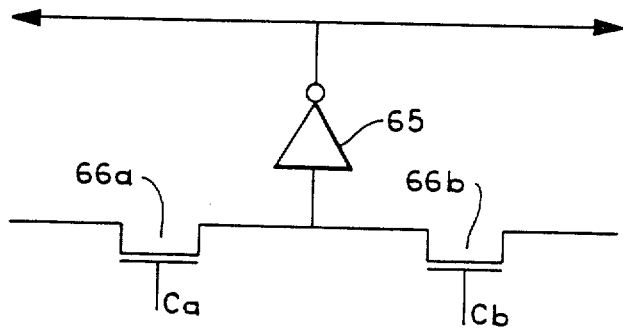

Alternate forms for symmetrical data cells DS in accordance herewith are illustrated in FIGS. 10 and 11. The cell of FIG. 10 is electronic, incorporating an inverter 61 and a pair of AND gates 63a and 63b. A pair of control lines Ca and Cb are indicated from the associated control element CE to selectively qualify one of the AND gates to pass either the predecessor or successor signal as explained above. The equivalency of the electronic or solid state cell of FIG. 10 to the electromechanical configuration of FIG. 9 will be apparent to one skilled in the art.

FIG. 11 illustrates another form of data cell incorporating an inverter 65 connected in a fashion similar to those of FIGS. 9 and 10. In FIG. 11, the switching operations by the control signals Ca and Cb are accomplished by a pair of elements 66a and 66b. Other alternate possibilities for data cells DS are numerous as will be evident to one skilled in the art.

A data cell need not be paired with any other cell and thus may not form a storage element at all. For example, referring again to FIG. 1, if all the data cells 12, 14, 16, and 18 are in the condition wherein each examines the input received from its predecessor, no storage elements FF exist. A reciprocal arrangement is required to establish a storage element FF as explained in greater detail below.

To consider the manner in which data is received, propagated, and stored in the data cells DS of the disclosed FIFO, reference will now be made to the state diagrams of FIG. 2 along with the data unit D shown in the drawings of FIG. 3. Note that the drawings of FIG. 3 are not in alphabetic order, but rather are designated for correlation with the individual state diagrams of FIG. 2. For example, the state diagram of FIG. 2A relates to the drawing of FIG. 3A.

In the drawings of FIG. 3, the data cells (as illustrated in FIG. 1) are depicted as inverters I1–I10 interconnected by switches S1–S10 as explained above with reference to FIG. 9. For convenience and simplification, the control elements CE are eliminated from the drawings of FIG. 3, as are the connections from such elements to the data cell switches.

Figure 2:
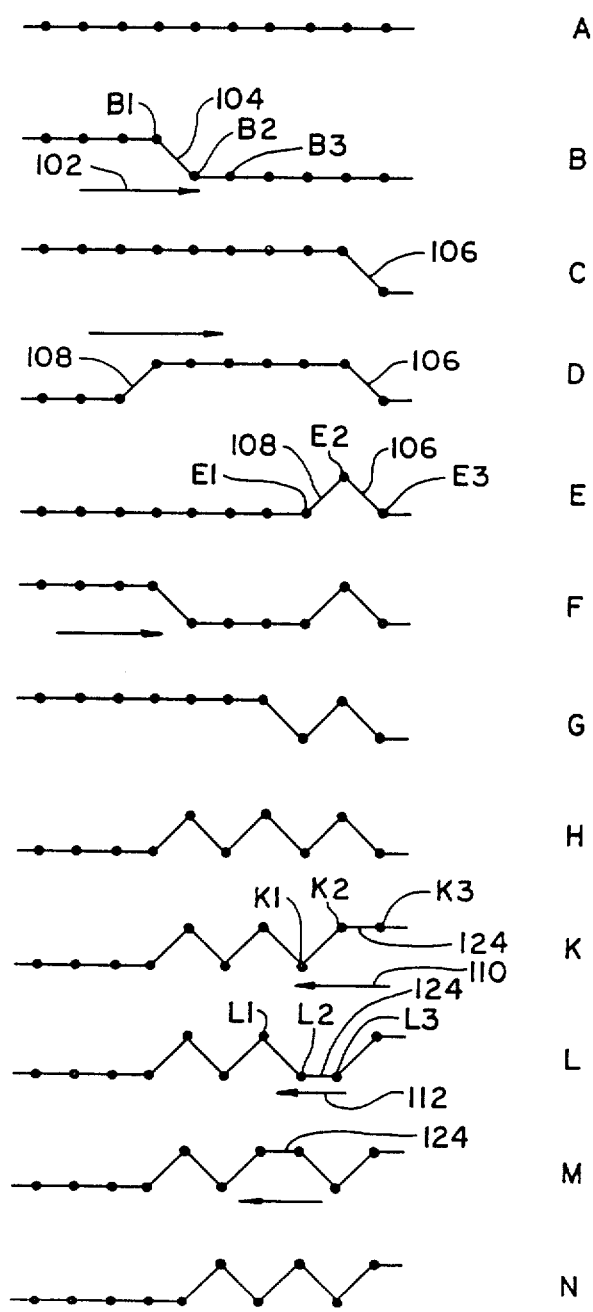
FIG. 2A through 2N show a set of state diagrams showing conditions of the control components in a system similar to that of FIG. 1 at various phases of operation.

The states of the control elements are indicated by the state diagrams of FIG. 2. The relationship will be apparent from the detailed examples set forth below. That is, while it is to be understood that the states of the switches are determined by the associated control elements CE (FIG. 1) those elements operate in accordance with a format as defined and explained in detail below.

While the inverters I1–I10 and the switches S1–S10 comprise ten data cells, of course, any number of data cells might be used.

Figure 3A:
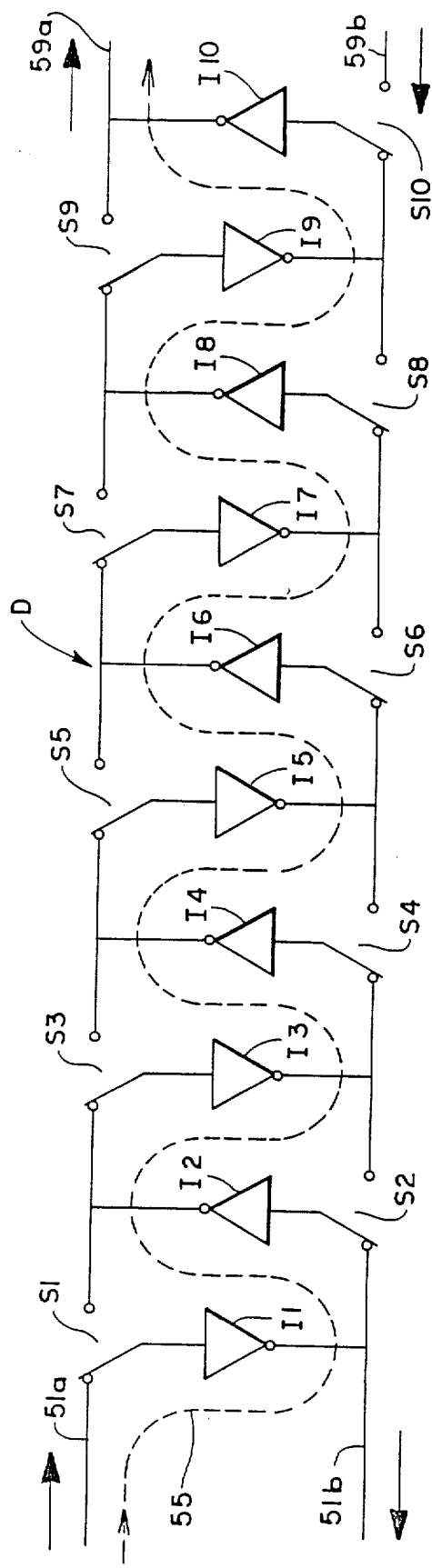
FIGS. 3A,3B,3E,3L and 3H show a series of circuit diagrams related to the diagram of FIG. 2 and illustrative of the data cell states in the embodiment of a system similar to that of FIG. 1.

The configuration of FIG. 3A illustrates the state of the FIFO when it is empty and stores no data. With the switches set as shown in FIG. 3A, there are no defined flip flops. When the FIFO of FIG. 1 is in this empty state, data (a binary signal level change) entering on a wire 51a simply is transmitted directly forward through each of the data cells 12, 14, 16, 18 to ultimately leave the FIFO on wire 59a without being stored internally. Similarly, when the FIFO (FIG. 3A) is in the empty state, data entering it on wire 51a follows the path of the dashed line 55 through the inverters I1, I2, etc. and the associated switches S1, S2, etc. for delivery to the output wire 59a. Thus, data from one processor is passed immediately to another processor, assumed ready to accept such data.

As data is received, the need for storage may arise and in that event, data is registered in the FIFO. Pairs of data cells then interact to define storage elements FF (FIG. 1) under control of the switches. A few further comments are pertinent to the data unit D. Note that the data cells shown in FIGS. 3 and 9 (by the action of inverters I) invert the sense of passing binary data. It will be clear to one skilled in the art that such inversions in each data cell cancel in a FIFO that comprises an even number of data cells. Data cells that do not invert are also possible, also the value of the data retransmitted by any one cell need not be identical to the value received, so long as the values are closely related. Thus, for example, each cell might invert or complement the data value, so that alternate data cells always transmit data in an unmodified form, and the other data cells always transmit data in an inverted form.

As suggested above, if stacked or multiple data units are provided, so that the FIFO carries values consisting of many bits (rather than the single binary bit as illustrated in FIG. 1), other kinds of data transformation are possible. For example, even numbered cells might add one to the binary value they receive, incrementing its value, and odd numbered cells might subtract one from the binary value they receive, decrementing its value. So long as the data transformations performed by any sequence of data cells cancel, the FIFO will operate properly. Alternatively, as explained below, useful computation can be accomplished by data cells that change the values of passing data.

Preliminary to considering data cell operations in detail and the setting of the switches S1-S10 (FIG. 3), it is helpful to understand the operation of the control unit C (FIG. 1). Consider the control unit C as illustrated in FIG. 1. It contains only four control elements 32, 34, 36, and 38, and typically, more elements will be used in an operating FIFO. However, the illustrated number is sufficient for explanation of the operation.

Figure 8:
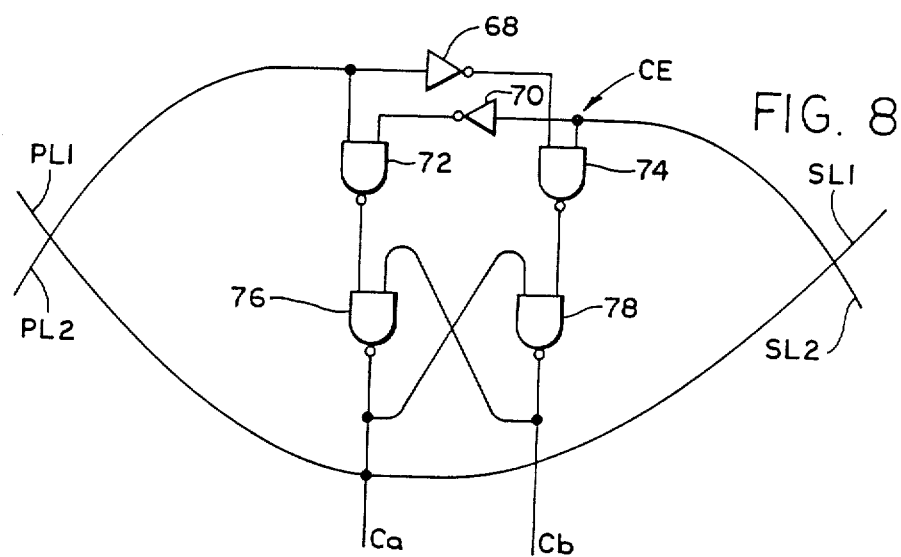
FIGS. 8, 9, 10, and 11 are schematic diagrams of elements comprising components for the embodiment of FIG. 1.

In the disclosed embodiment of the invention, each of the control elements 32, 34, 36, and 38 (FIG. 1) has two states. Binary signals Ca and Cb illustrated in FIGS. 8, 10, and 11 are conditioned by those states to command one of the actions of the data cells described above. Each control element CE is connected to its predecessor and successor elements CE, such connection being illustrated by the lines 40a, 42a and 44a. The double arrows on the lines indicate that information flows in both directions, the circle at the center of each line indicating that each line may represent several signaling wires, typically two.

The first and last control elements 32 and 38 are connected respectively to the input and output ends of the FIFO by wires 62a, 62b, 64a, and 64b. It is important to remember that between the terminal elements, each control element CE has a predecessor element and a successor element. Which is predecessor and which is successor may vary with the direction of data flow in the FIFO; however, in the embodiment of FIG. 1, data flows from left to right.

At this juncture a very important operating philosophy can be meaningly stated. Each of the control elements 32, 34, 36, and 38 obeys an operating legend to set its control state and establish the control signals Ca and Cb. The legend can be stated: "If P≠S, COPY P; If P=S, STAY". The legend describes the philosophical operation of each element in the control unit and is stated for convenience in the drawing.

The letters P and S refer to the control states of the predecessor and successor control elements respectively. Elaborating then, the statement "If P≠S, COPY P" specifies the control element operating rule to copy the control state of its predecessor element if its predecessor and successor are in different control states. The statement "If P=S, STAY" specifies the control element operating rule to stay in its present control state if its predecessor and successor are in the same control state. Those two operating rules are the sole criteria for the operation of the internal control elements CE as indicated in FIG. 1.

FIG. 8 is a schematic diagram of a control element known as a Muller C element well known in the art and suitable for use in the control unit, as the elements CE. More complex control elements for asynchronous sequential FIFOs might be designed. For example, a control element with three states might be connected to three data elements so as to make them operate cyclically. A variety of other arrangements may prove useful and economical.

The Muller C element of FIG. 8 is formed of inverters 68 and 70 (top), well known logic elements operating in combination with NAND gates 72, 74, 76, and 78 also well known logic elements. The gates 76 and 78 are cross coupled with second inputs from the gates 72 and 74 to provide outputs Ca and Cb in accordance with the rule of essential operation as stated above, e.g. P≠S, COPY P; P=S, STAY as set.

The states of the preceding (P) and subsequent (S) elements CE are manifest respectively on the lines PL2 and SL2. The state of this control element, manifest on output Ca is delivered to the preceding and subsequent control elements respectively on the lines PL1 and SL1.

Relating the essential stated operating rules to the system of FIG. 1, some examples now will be helpful. Consider the three control elements 32, 34, and 36 of FIG. 1. If all are in the same state, the middle control element 34 will remain in that state. The middle element 34 also will remain unchanged if its state differs from both of the other adjacent elements. If, however, the outer two elements 32 and 36 differ in state, the middle element 34 will assume the state of the predecessor element 32. Note that these state changes occur independently of any clocking or timing signals. That is, the operation is asynchronous. Consequently, alignments and changes within the control unit are limited only by the operating speed of the component elements. To depict such operations, reference will now be made to FIG. 2.

For an assumed practical operation, the state diagrams of FIG. 2 illustrate the activity of a control system in a FIFO that is longer than the one illustrated in FIG. 1. For, effective explanation, the FIFO whose operations are depicted in FIG. 2 has ten stages that are intended to match the ten stages of the drawings in FIG. 3. Of course, any number of stages could have been used.

The lines in FIG. 2 (state diagrams) labeled A through N each depict the states of the individual control elements in the FIFO under different conditions. A series of dots on each line in FIG. 2 represent in sequence the current states of all ten of the supposed control elements CE in a control unit of a FIFO. As the control elements CE control the switches S1-S10, the dots by their high or low states also indicate the state of the binary switches S1-S10. Thus, each line may be considered segmented to manifest all control states (binary) at a particular instant of time during operation of the FIFO.

The left dot on each line indicates the state of the first control element, i.e the control element that drives the switch S1 (FIG. 3A) The right dot on each line (FIG. 2) indicates the state of the last control element, and the element that drives the switch S10. The vertical position of dots along the lines represent the state of the corresponding control element in the FIFO sequence to drive the switches S2–S9 in the data elements of FIG. 3. Specifically, to depict a control element in a high state, the dots and lines in FIG. 2 are elevated at sections of their length corresponding to the location of the control element in the FIFO. If the control element is in a low state, the corresponding dot and section in the line is depressed. Thus, diagonal segments of the lines in FIG. 2 (center, line B) represent FIFO locations where the states of two adjacent control elements differ. Further with regard to the representation format of the state diagrams, arrows as shown near the lines in FIGS. 2B, 2D, and 2F indicate unstable or transitory conditions.

In FIG. 2A, the FIFO is depicted as empty. The condition is analogous to that represented for the data unit D in FIG. 3A. All the switches S1–S10 (FIG. 3A) are positioned to the left as indicated, to provide a continuous path through the data unit D. None of the data elements DS are coupled to provide a register FF. All of the dots (FIG. 2A) are in the lower of the two positions.

Figure 3B:
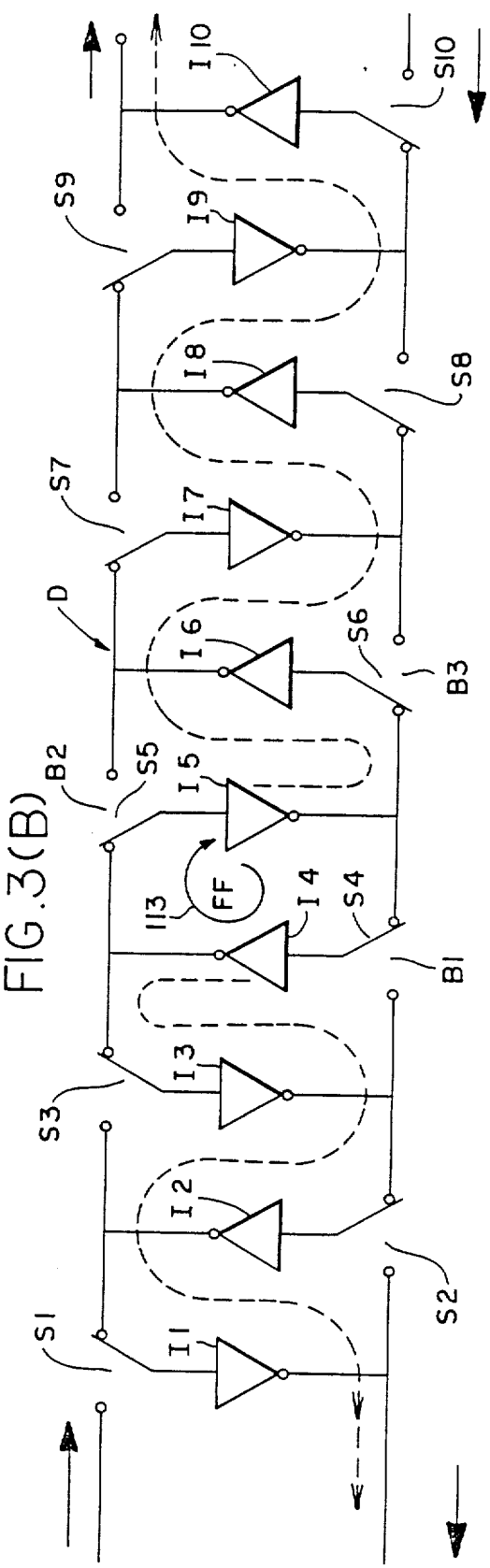
Figure 3:
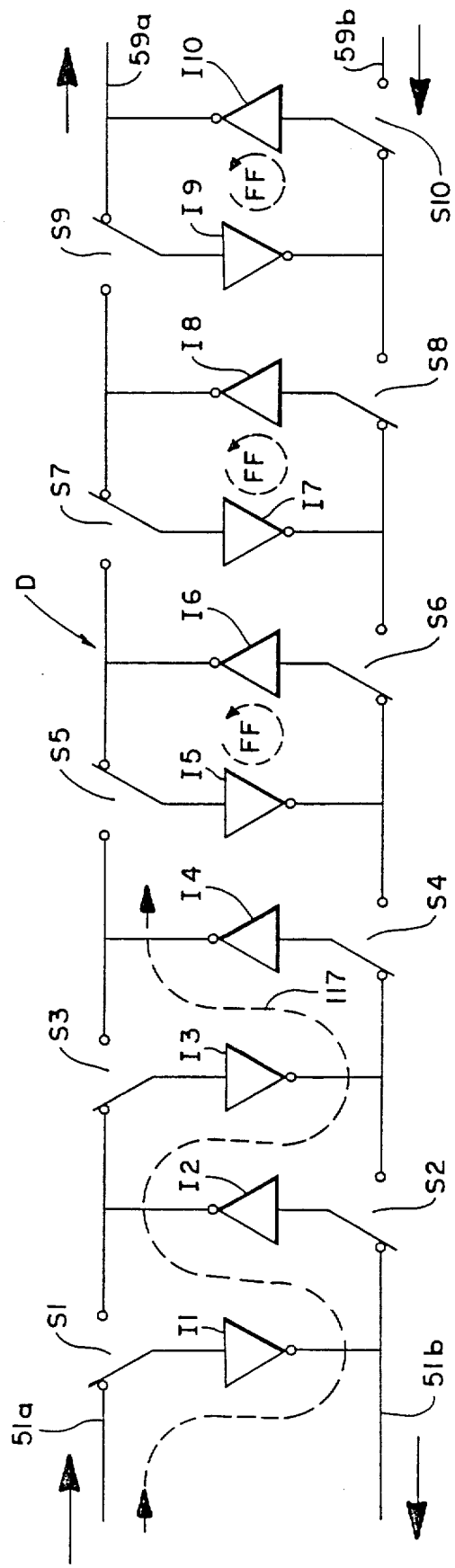

FIG. 2B shows the data unit D in a condition of having received a bit that is being advanced in the FIFO. Thus, an edge 104 (state difference) as illustrated above the arrow 102 depicts a dynamic condition in which the control state difference is moving through the data unit towards its output end. The dynamic condition is depicted in the data unit D by FIG. 3B. The control state difference will drive data bits through the data unit D as we shall see, causing them to form of what may be considered a lineup, as a queue of people. The control-state movement occurs in accordance with the rules set out above. For example, referring concurrently to FIGS. 2B and 3B consider the three represented control elements with states indicated by dots, specifically labeled B1, B2, and B3. Prior dots are high, later dots are low. In FIG. 3B, the states of the switches S4, S5, and S6 are represented in states B1, B2, and B3, respectively.

At the instant depicted, the switch S5 represented by the dot B2 will soon change to the elevated state, because the state of its predecessor switch S4 represented by dot B1 and the successor switch S6 represented by the dot B3 differ. On the other hand, the switch S4 (dot B1) is stable because although its predecessor switch S3 and its successor switch S5 (dot B2) differ in state, switch S4 has already reached the same state as its predecessor as indicated by the horizontal line to its left. Thus, the diagonal edge 104 (FIG. 2B) will step to the right and continue stepping to the right in the direction in which information passes through the FIFO. Thus, as a general rule, any isolated diagonal edge in the representations of FIG. 2 will move to the right in an action analogous to people closing up a line. Sections of horizontal lines between dots in FIG. 2, on the other hand, indicate stable, clear conditions.

As in the cases treated above, the state diagrams of FIGS. 2A through 2N are related to the situations represented by the select diagrams of FIG. 3 bearing similar letter designations. In the diagrams of FIG. 2, the right end of the lines correspond to the output end of the FIFO. Note that the last control element is held, i.e. not permitted to change state until the receiving processor is ready. Thus, when the diagonal edge 104 of FIG. 2B reaches the output end (right) of the data unit, it will remain there as the edge 106 illustrated in FIG. 2C awaiting the time when an output from the FIFO can be accepted. In that regard, assume a situation in which a number of data bits are received before the processor and the output is ready to accept such data. That occurrence is treated below with reference to the drawings of FIGS. 2 and 3.

A second wave of activity indicates a second input datum. Specifically, level changes occur in the binary input lines 51a and 51b (FIG. 1) to indicate a data bit. Afterward, with state changes in the binary signals at lines 62a and 62b of the control unit C, the data bit is accepted in the-data register D. The control action initiated as a wave 108 at the input end of the FIFO moves into the control unit C as illustrated in FIG. 2D, coming to rest against the first wave 106, as finally indicated by FIG. 2E. When the wave 108 reaches the end of the line in the FIFO, the states of control element states and switch states are represented by dots E1, E2, and E3 (FIG. 2E). The state represented by special dot E1 is stable because its predecessor state dot (not labeled) and its successor, state dot E2, differ in state. State dot E1 already has taken the same state as its predecessor. State dot E2 is stable because its predecessor state dot E1 and its successor state dot E3 have the same state (opposed to that of dot E2). Dot E3 is stable because it is prevented from changing by an imposed condition at the output of the FIFO.

The state depicted collectively by the dots in FIG. 2E as described above sets up the data unit D as illustrated in FIG. 3E. Note that the switch S9 (dot E2) is set to the right while the remainder of the switches (S1–S8 and S10) are to the left.

As additional waves of control activity which accompany additional input data arrive at the input of the FIFO (FIG. 2F), they will close or stack up in a line at the output end (right) as illustrated by FIGS. 2G and 2H. The registration process depicted in FIG. 2H involves three flip flips FF as indicated in FIG. 3H. The switches S5, S7, and S9 are to the right as indicated by the elevated dots in FIG. 2H.

Again, it is important to appreciate that these changes and operations are not clocked, rather movement is asynchronous. Also, control element states as manifest at the edges leave the FIFO as data is accepted by the output.

Next, consider further the interaction between control elements and data cells somewhat more explicitly. Recapitulating to some extent, recall that movement of data bits in the data unit D is somewhat analogous to the movement of people in an orderly line. The first arrival immediately moves to the head of the line. Each subsequent arrival takes a place at the end of the line. Additional aspects of the line analogy are also important. Specifically, as each opening occurs at the head of the line, the line immediately closes. Also, new arrivals immediately move to occupy the last position in the closed line. The analogy is deemed helpful in appreciating the asynchronous operation of the FIFO, independent of timing constraints. As in an orderly line of people, data bits in a FIFO immediately close up at the front of the line to exit in order, regardless of the space available behind them. As described below, the initial empty condition of the FIFO, seen in FIGS. 2A and 3A, will be analogous to a line space without occupants.

The data cells in the FIFO take data either from their predecessor or successor cells according to the state of their corresponding control element. In effect, each control element sets the position of the switch exemplified by switch 52 in FIG. 9. As indicated above, the switch 52 of a data cell can be related to states as described with reference to the state diagrams of FIG. 2.

Assume for the moment that the control state illustrated when a dot in FIG. 2 is depressed (as at point B2) causes the corresponding data cell DS to accept data from its predecessor. With this assumption, FIG. 3A illustrates the action of the data cells when the control is in the state described by FIG. 2A when the FIFO is empty (no one in the line). That is, if all of the control elements are in the state represented in FIG. 2A (all dots depressed), the FIFO is empty because no data is stored in it, and all data cells simply pass data forward along the path illustrated by the dashed line 55 in FIG. 3A. No data storage is involved. An arrival simply passes through the line-up space without waiting. Note that if the switches S1 through S10 were thrown to the reverse position from that of FIG. 3A, the data flow would be in the opposite direction. Thus, the term retrograde data path is appropriate.

When a change in the control state is initiated, as illustrated by FIG. 2B, a transient storage condition occurs. Data cells early in the FIFO (corresponding to the dots on the elevated part of the line in FIG. 2B) pass data backwards, while data cells later in the FIFO corresponding to the dots on the depressed part of the line in FIG. 2B pass data forwards. This condition is illustrated in FIG. 3B. Notice that between the two sections of elevated and depressed dots, exactly at the place that corresponds to the diagonal line 104 in FIG. 2B, data circulate between two data cells as illustrated by the circular arrow 113 (FIG. 3B) and the legend FF at the center of FIG. 3B. Note also that the switches designated B1, B2, and B3 in FIG. 3B are set as designated by the control states B1, B2, and B3 in FIG. 2A. In this condition, a bit is stored in the FIFO. However, the location of the data cells that store the bit moves as the wave (diagonal line 104) of control activity propagates to the right.

Just as the control state dot B2, represented in FIG. 2B, is the next to change, so the related switch S5 (state B2) in FIG. 3B will be the next to change. As soon as the switch S5 changes, the location of the circular storage loop in the data path illustrated by the circular arrow and the legend FF in FIG. 3B moves to the right one position. In fact, every downward sloping line in FIG. 2 corresponds to a pair of adjacent control elements that differ in control state and create a loop FF at the corresponding position in the data path as illustrated by the loop 113 in FIG. 3B.

When two transitions have propagated through the control unit C, it will have the state illustrated in FIG. 2E. FIG. 3E (labeled for coincidence) shows the corresponding state of the data unit. Notice that the previously transmitted data value is captured between the last data cell 112 (FIG. 3E) and the next-to-last data cell 114, while all other data cells are transmitting new data forward from the input terminal 51a without any storage as far forward as possible along the path indicated by the long dashed arrow 115.

Somewhat similarly, FIG. 2G represents the state of the control unit when two bits are stored in the FIFO. FIG. 2H represents the state of the control when the FIFO is about half full. In this condition, three bits are captured between successive data cells as illustrated by the zig zag line at the right of FIG. 2H and at the right side of the unit as illustrated in FIG. 3H. Meanwhile, all other data cells are transmitting new data forward from the input terminal 51a (FIG. 3H) without any storage as far as possible along the path indicated by the long dashed arrow 117.

Consider now the control actions for removing data from the FIFO. FIGS. 2H through 2N illustrate the action of the control elements for moving data out of the FIFO. In FIG. 2H the dots define three humps, each including two edges. The edges of these humps represent the fact that the last seven control elements CE in the FIFO are in states that differ alternately. So also, the switches in the last seven data units DS also alternate in state. Note that this is a stable condition, because each control element either is in the same state as its predecessor or is preceded and followed by control elements in the same state. If the last control element is now permitted to change state, as would be permitted when a data bit is accepted from the FIFO, the state shown in FIG. 2K would be reached. However, the state of FIG. 2K is not stable as indicated by the arrow 110.

Consider the three control elements represented by the state dots K1, K2, and K3 in the face of the operating rule. The state of the control element corresponding to dot K1 is stable because its predecessor (not labeled) and successor, represented by K2 are in the same state. The control element represented by the state dot K3 is stable because it is in the same state as its predecessor (dot K2). The control element represented by the dot K2, however, is not stable because its predecessor (dot K1) successor (dot K3) are in different states. Consequently, the control element represented by the dot K2 will change state to create the situation illustrated in FIG. 2L. That state (FIG. 2L) is unstable as indicated by the arrow 112. The elements CE involved in the change are represented by the state dots L1, L2, and L3. The elements will rapidly change to the state illustrated in FIG. 2M again shifting the line segment 124. That is, note that the short flat section of the line 124 at the end of FIG. 2K has moved to the left in FIG. 2L and further to the left in FIG. 2M. The line segment 124 will continue to move to the left until the stable condition, as shown in FIG. 2N is attained. The short flat line segment 124 represents a pair of adjacent control elements that are in the same state. As the adjacent common state pair of represented control elements propagates to the left, it permits data stored in the FIFO data cells to move forward by one cell.

Again, as indicated above, the data units DS that correspond to the above-described activity are illustrated in the related FIG. 3L depicting the unstable control element condition illustrated in FIG. 2L. Essentially, the transitory flip flops FF are closing at the right of the data unit D. As represented by the state dot L2 (switch S8) an unstable condition exists which will cause the switch S8 in FIG. 3L to change. When the switch S8 changed previously, the data bit stored between the cells controlled by the elements of dots L1 and L2 was permitted to flow forward into the next cell. When the switch S8 changes, the same data bit previously stored to the left of its data cell will be stored to the right of the cell.

Notice that with the switches in the condition as depicted in FIG. 3L, the signals delivered to both sides of the switch S8 are the same, as illustrated by the two flip flop FF arrows 125 and 127. So changing the switch L2 will recapture the same value to the right of its cell as was previously stored to the left of the cell. Changing switch S8 will move forward by one cell the location at which the data value is stored from virtual flip flop 125 to virtual flop flop 127. As successive control elements change state, proceeding from right to left in FIG. 3L, successive stored data bits similarly will be moved forward by one data cell each.

Observe that the rule "IF P≠S, COPY S; IF P=S, STAY" (obeyed by each control element) causes activity to propagate in the forward direction where all control elements have the same state and activity to propagate in the reverse direction where control elements have alternating states. These actions correspond to the rightward propagation of isolated angular lines in FIGS. 2A through 2H and the leftward propagation of isolated flat lines, e.g. line segment 124 in FIGS. 2K through 2N. It must be understood that because the control system is entirely asynchronous, several such propagations can be underway at once.

From the above examples it will be apparent that the FIFO of FIG. 1 accepts available data, stores it in a "first-in-first-out" configuration and provides it in the same order. Furthermore, it will be apparent that the FIFO is independent of any clock control or other synchronization. Consequently, the FIFO can couple processors that produce and accept data signals on completely different schedules. The simple limitation in that regard is that over a protracted period, the volumes of data generally coincide. Thus, a system is available offering the advantages and improvements as set out above in the introductory material.

Another aspect of the present invention may be employed to improve the connections between data cells and their respective control elements. In related art, it is known that a plurality of data cells can be controlled by a single control element. For example, when data elements with more than one bit of information are processed, several data units are used, and each control element is connected to the several corresponding data cells, one from each data unit. However, in general, prior known FIFO designs have taught that all of the data cells connected to a single control element should be connected to it in an identical fashion.

Figure 4:
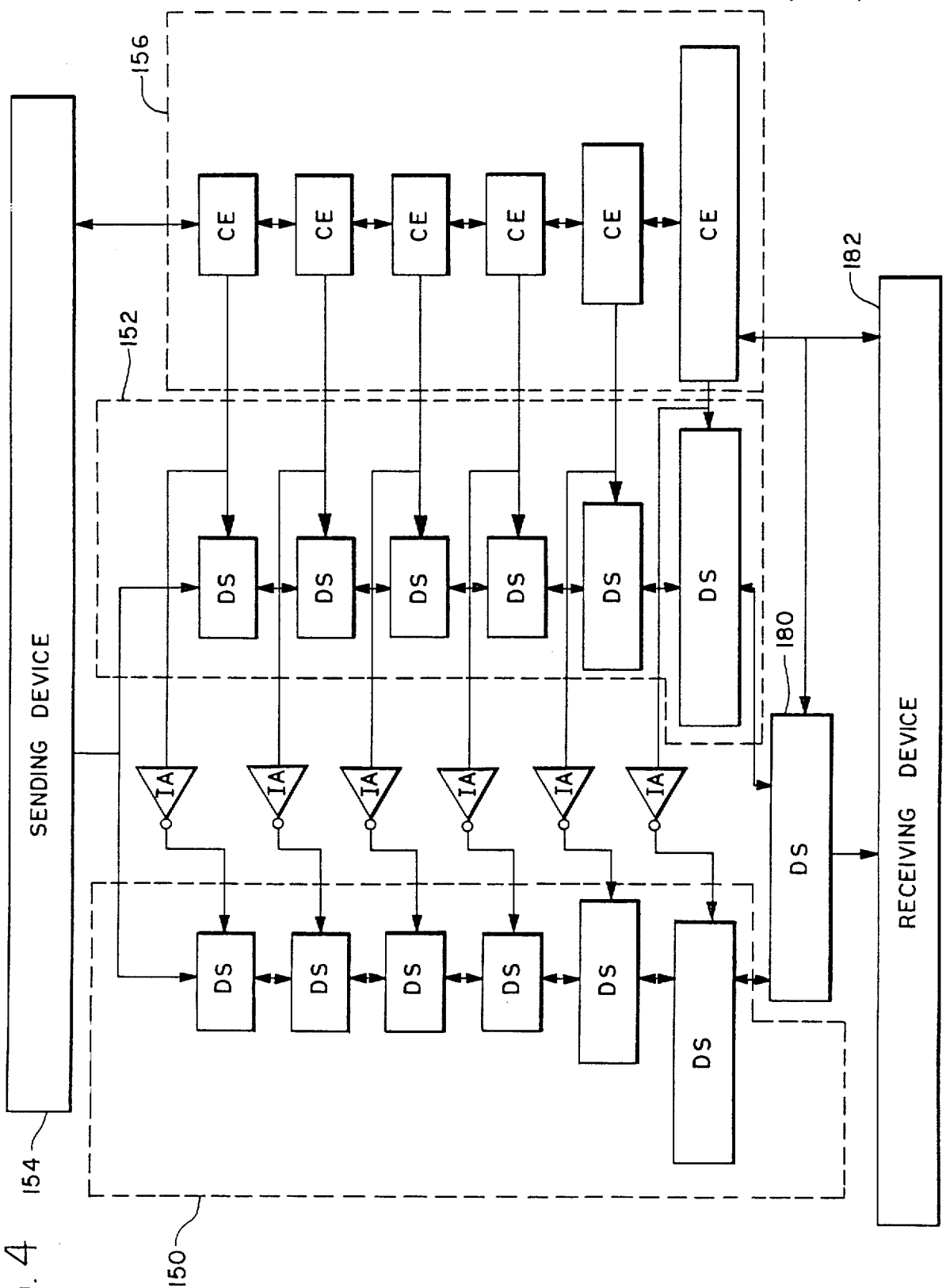
FIG. 4 is a block diagram of an enhanced embodiment of the present invention showing an alternative configuration of data elements to control elements.
Figure 5:
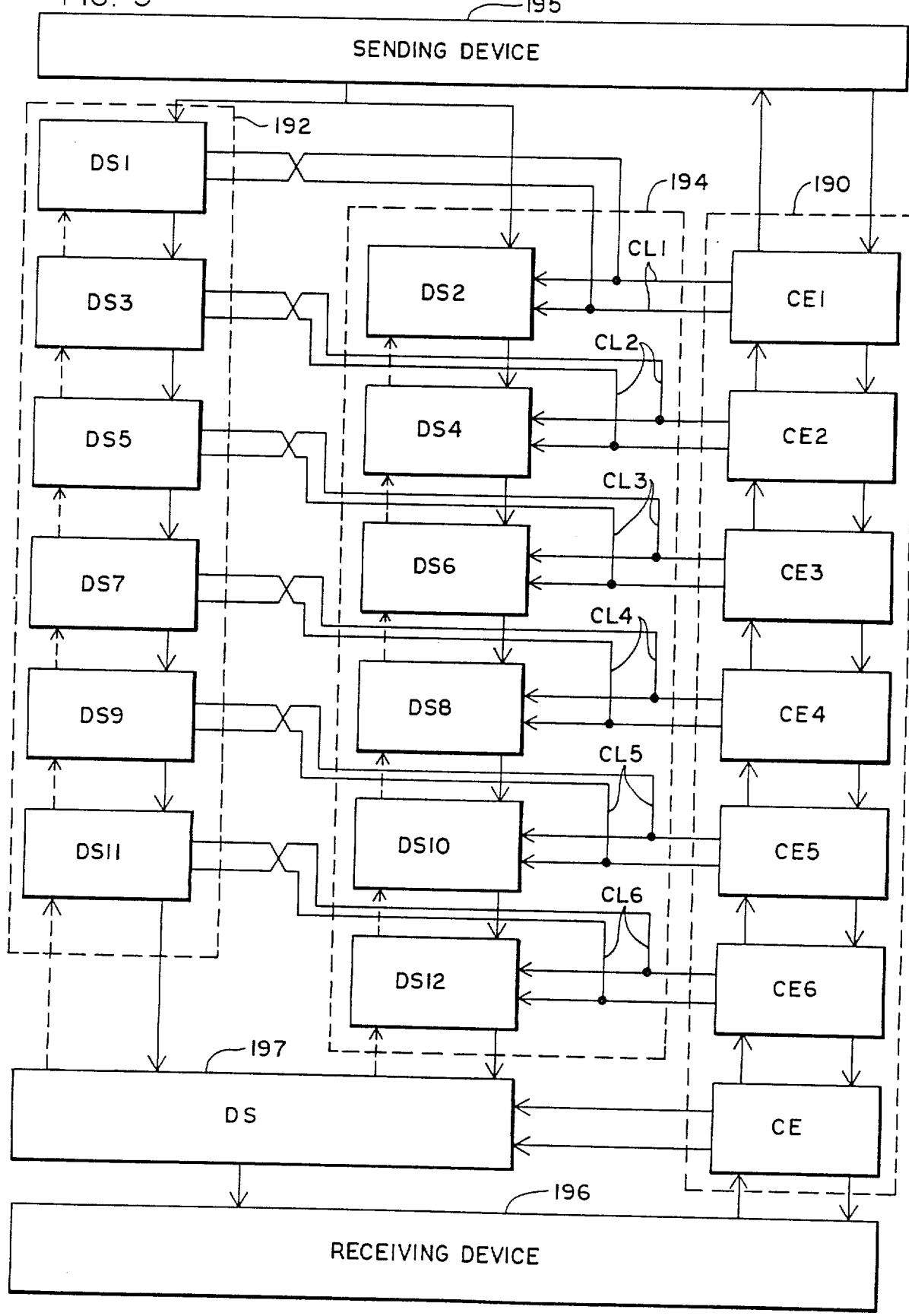
FIG. 5 is a block diagram of another form of the present invention showing another configuration of data elements to control elements.

In the asynchronous sequential FIFO of the present invention, two or more different data cells may be connected advantageously to each control element, using different kinds of connections. FIG. 4 and FIG. 5 illustrate two such possible connection schemes for multiple data cells to control elements. Although all of the data cells are the same, they can be connected to their control elements in different ways.

In FIG. 4 two data units 150 and 152 (dashed line blocks) are shown for receiving data signals (digits) from a sending device 154 (top central) which may comprise any of a variety of processors. Movement of data through the data units 150 and 152 is effected by a control unit 156 (dashed line block, right).

The data cells DS in each of the data units 150 and 152 may be as described above with reference to FIG. 9, each being represented as interconnected for supplying and receiving signals both to the predecessor and successor cell just as described above. The interconnections of the individual data cells DS and control elements CE within the data units 150 and 152 and the control unit 156 may be as described with reference to the system of FIG. 1. The data cells DS in the data unit 152 each are connected directly to corresponding control elements CE in the control unit 156 while the data cells CE in data unit 150 are each connected through an inverter IA to a corresponding control element in control unit 156. Thus, each data cell DS in the data unit 150 is connected to a control element CE in the control unit 156 through an inverter IA. Each data cell DS in the data unit 152 is connected directly to a control element CE in the control unit 156.

Note that the progressively larger block sizes represented for the data cells DS in both the data units 150 and 152, as well as the similarly scaled control elements CE in the control unit 156 has a particular significance. Specifically, the larger units are designated to have the capacity for handling increased power. The details of such a structural arrangement are treated below.

The multiple connections of data cells DS to the control elements CE in the two different units 150 and 152 is useful because such embodiments permit different actions to take place simultaneously in the data units 150 and 152. Recall that as previously described, only the forward sloping lines in FIG. 2 represented locations at which data was captured between data cells. In the embodiment of FIG. 4, data is captured between data cells DS in either the data unit 150 or the data unit 152 every time any two adjacent control elements are in opposite states. In terms of the state illustrations of FIG. 2, this means that every diagonal line in FIG. 2 represents a place where the state of two adjacent control elements differ and each such difference will cause a single data bit to be stored between the corresponding data cells.

Figure 6:
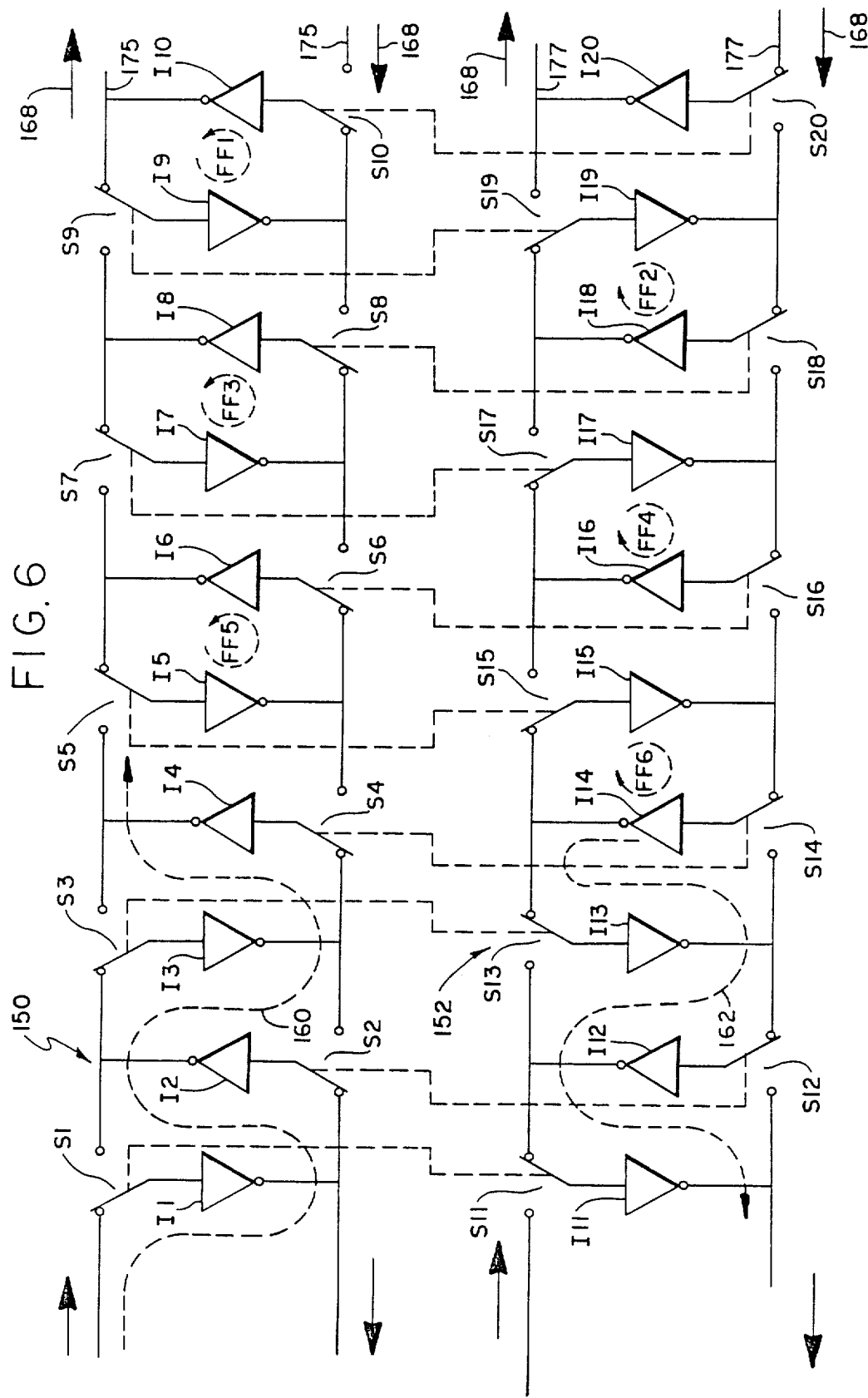
FIG. 6 is a circuit diagram illustrating two data units as might be substituted for the data unit of FIG. 1 to provide another embodiment of the present invention where pairs of data cells, one from each data unit, are controlled by each control element in a control unit.

The action of the data cells DS in the FIFO embodiment of FIG. 4 is illustrated in FIG. 6 showing representations of the two data units 150 and 152 and including the inverters and switches. The data units 150 and 152 are generally designated, each in an aligned configuration of elements as explained previously. The data unit 150 includes inverters I1–I10 interconnected as previously explained by switches S1–S10. In a similar configuration, the data unit 152 includes inverters I11–I20 interconnected by switches S11–S20.

Notice that for every switch in the data unit 150 that is set to the right, the corresponding switch in the data unit 152 is set to the left, e.g. switch S1 is left and switch S11 is right. This action corresponds to that obtained by the connections illustrated in FIG. 4 as a result of the inverters IA (FIG. 4).

Assume now, for example, that the states of the control elements CE in the control unit 156 (FIG. 4) correspond to establish the switch settings shown in FIG. 6 which match those of FIG. 2H. That is, the FIFO is said to be about half full, which means that several data bits are stored in it, as illustrated (FIG. 6) by the circular arrows FF1, FF3, and FF5 (unit 150) and FF2, FF4, and FF6 (unit 152). Meanwhile, the data cells toward the left of FIG. 6 are not involved in storing data values. Those in the data unit 150 are transmitting information forward from the input terminal without any storage as far as possible along the path indicated by a long dashed arrow 160. Those in the data unit 152 are transmitting the information stored in FF6 backward as indicated by a dashed arrow 162. Though it seems peculiar to have data cells transmitting information backwards, this retrograde data transmission is characteristic of this type of FIFO and is necessary to permit ready formation of new flip flops FF as required.

Notice that the data bits stored between the data cells DS (inverter and switch combinations) in the FIFO of FIG. 6 occupy alternate positions in the data units 150 and 152. For example, note the offset between flip flops FF5 and FF6. Where a pair of cells in the unit 150 has captured a data bit, the corresponding pair in the unit 152 has not, and vice versa. This alternation of position is caused by the different connections of data cells to control elements as illustrated in FIG. 4.

Because of the alternation, the data bits stored in the FIFO of FIG. 6 will arrive at its output end alternately. As illustrated in FIG. 6, the rightmost stored bit FF1 in the data unit 150 is being delivered to the FIFO output (arrows 168) on lines 175. When this data value has been taken out of the FIFO and the last control cell changes state, the position of the two switches S10 and S20 in the last data cells of units 150 and 152 also will change. As soon as the switches S10 and S20 change position, the next data bit FF2 (stored in the data unit 152) will become available at the FIFO output on lines 177.

Because the locations where data values are stored alternates between the two data units 150 and 152, the asynchronous FIFO of FIG. 4 is able to accept or deliver a new data bit for each transition of the corresponding control signals.

Of course, as shown in FIG. 6, the outputs from the FIFO are delivered on pairs of output wires, e.g. lines 175 (unit 150) and lines 177 (unit 152). Obviously a switch is required to collect the information together from output lines 175 and 177. Such a switch mechanism can be controlled by an additional data cell 180 as illustrated in FIG. 4 connected between the data units 150 and 152 and the receiving device or processor 182.

It is to be understood that the two data units 150 and 152 in FIG. 4 could each be replicated several times if data values with more than a single bit were desired. In a complex FIFO, the several data units would be connected to their control elements in groups; the connections within a group being similar, but the connections of different groups to the control elements will differ.

Another embodiment of a more complex FIFO with multiple data units is depicted in FIG. 5. A control unit 190 (right, dashed block) operates two data units 192 and 194, buffering data between a sending device 195 and a receiving device 196. A switching data unit 197 is analogous to the similar unit 180 of FIG. 4, the structure of which simply may comprise several data switches.

In the system of FIG. 5, each control element CE (individually numbered) controls two data switches DS (individually numbered). The pattern is consistent beginning from control element CE1 controlling data cells DS1 and DS2, and concluding with control element CE6 controlling data cells DS11 and DS12. Note that each data cell DS in this configuration is tied to an associated control element CE by two wires. These wires are similar to the wires Ca and Cb of FIGS. 8, 10, and 11. Notice also that in the embodiment of FIG. 5 the two control wires enter the left data cells in order, but are interchanged before controlling the right data cells. For example, the control lines CL1 are inverted from the connections of the data cell DS1 to the data cell DS2. The connections of lines CL2-CL6 are similarly oriented. This system illustrates another form of connection from data cells to control elements. Such different connection formats of data cells to control elements serve not to extend the width of the data elements treated, but rather to provide for more rapid operation of the FIFO.

The operation of the system of FIG. 5 is essentially similar to that explained with reference to the offset system of FIG. 6. Note that arrows between the data units DS1-DS20 illustrate the data flows, as explained above, with regard to signal paths.

Turning now to another consideration, it is well recognized that the rate at which data values can be delivered through the output terminals of an integrated circuit may be much slower than the rate at which internal computations can be performed. The reason that the output terminals to external circuitry operate more slowly is that they must deliver much higher power signals than are required internally in the circuit. The FIFOs described here are suited to providing much higher throughput rates at the output terminals of integrated circuits than has heretofore been considered possible.

Fundamental to the problem of driving external circuits is the very small size of the transistors in the integrated circuit. Such small circuitry is not powerful enough to drive large external circuits quickly. Integrated circuits today, therefore, commonly include "pad drivers" which use large transistors able to drive large external wires. Unfortunately, although the tiny internal circuits can operate quite quickly, it is usually difficult to build pad drivers that operate quickly.

The asynchronous sequential FIFO described herein provides a new form of asynchronous output mechanism that can operate more quickly. As mentioned above, in FIG. 4 the later stages of the FIFO are drawn with successively larger boxes. This symbolism is to indicate that the transistors of the later stages of the FIFO system are successively larger, until the final output stage is large enough to drive the external circuits. Because each such stage of such a system drives a stage only slightly larger than itself, its operation will be nearly as fast as a stage driving a stage identical to itself. In such a system of progressively sized data cells and control elements, data can be moved very rapidly out of the FIFO because the data bits nearly ready to leave the FIFO have already been moved into quite large circuits. In effect, the amplification time required for output is overlapped with the time otherwise occupied in rearranging the data within the FIFO. Use of this feature makes possible asynchronous FIFO circuits with very high performance even for driving large output loads.

Figure 7:
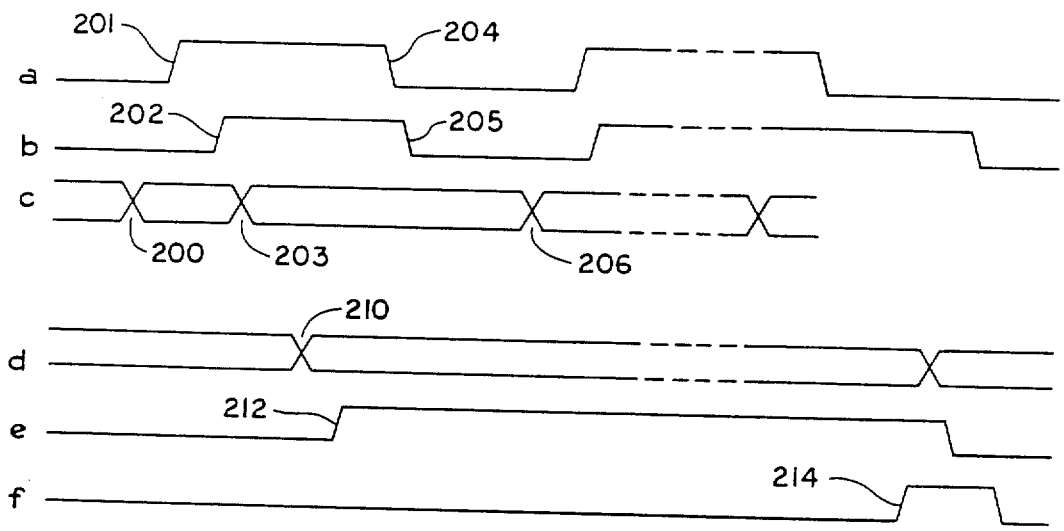
FIGS. 7A through 7B show timing diagrams indicative of the action of the control section of the embodiment of FIG. 1.

The input and output protocol for the asynchronous sequential FIFO as described herein is similar to protocols known in the prior art. FIG. 7 is a timing diagram that illustrates this protocol. In FIG. 7, time is illustrated moving from left to right. The state of various control and data signals changing with time is illustrated by the various lines shown in the figure, each manifesting a binary signal.

The line representation of FIG. 7a depicts the state of the control input wire 62a in FIG. 1 showing edges 201 and 204. The line representation of FIG. 7b depicts the state of the control output wire 62b in FIG. 1 showing edges 202 and 205. The two line representations of FIG. 7c represent the state of the data input wire 51a in FIG. 1. The line representations of FIG. 7c are split to illustrate that the value of the data bit carried on wire 51a does not matter; what does matter is that the points in time at which that value can change either from "high" to "low" or from "low" to "high" in a binary format, as illustrated at cross-over locations 200, 203, and 206. FIGS. 7d, 7e, and 7f represent the actions at the three output wires 59a, 64a, and 64b, respectively. The protocol used at the FIFO input and output is accordingly evident, however, some specific comments may still be appropriate.

First, the sending device uses transition 200 to establish the correct value of the data to be put into the FIFO. Next, the sending device signals the presence of correct data by changing the state of the input control wire 62a as illustrated by transition 201. After that, the sending device must wait for the FIFO to respond to the first data entry. The FIFO will respond to input transition 201 with a matching transition 202 on wire 62b. It is improper for the sending unit to change the value of the data input 51a at a time between represented transitions or edges 201 and 202.

After the sending unit has received transition 202, it may insert another data value using transition 203. It signals the correctness of the second data element by making transition 204 on input control wire 62a. Again it is improper for the sending device to change the value of data input on wire 51a between sending transition 204 and receiving the corresponding response 205 from the FIFO. So data input to the FIFO proceeds, with transitions on wires 51a, 62a, and 62b occurring in sequence. Notice that this input protocol puts a data value into the FIFO for each transition of each control wire.

The output protocol for the FIFO is identical. Two output steps are illustrated in FIGS. 7d, 7e, and 7f. The FIFO will establish a correct data value on its data output wire 59a (FIG. 1) using an edge or transition 210 if necessary and will then signal that valid data are present using a transition 212. The receiving device must then acknowledge receipt of this output information by making a transition 214. Notice in FIG. 7 that although transition 214 occurs much after transition 212, the FIFO made no further changes to wire on line 59a or 64a until after transition 214 was given. The transitions in lines 59a, 64a, and 64b must follow in sequence just as did the transitions at the input of the FIFO.

The timing of transitions at the input end of the FIFO, illustrated by the line representations of FIGS. 7a, 7b, and 7c are almost independent of the timing of the transitions at the output end, as illustrated by the three line representations of FIGS. 7d, 7e, and 7f. However, one important relationship between input and output involves transitions 210 and 200. Transition 210, which represents the arrival of the first data at the output end of the FIFO, must, of course, follow transition 200, which represents the presentation of that data at the input end. The delay between transition 200 and transition 210 depends on the number of data cells between input and output and the speed of the individual data cells. This delay is called the "data latency" of the FIFO. Similarly, transition 212, which represents the arrival of the first control element activity at the output end of the FIFO, must also follow transition 201, which initiated the control activity at the input end of the FIFO. The delay between transition 201 and transition 212 depends on the number of control elements between input and output and the speed of the individual control elements. This delay is also called the "control latency" of the FIFO. For proper operation, the FIFO must be designed so that the control latency is greater than its data latency.

Other than these obvious dependencies, the timing of the input and output parts of the FIFO are quite independent. In the sequence shown in FIG. 7, for example, several input data elements are put into the FIFO, illustrated by transitions 203, 206, and so forth before the first one, which arrived at the output at transition 210, is finally accepted by the receiving device, as illustrated by the transition 214.

FIG. 7 illustrates another aspect of the present invention, namely its ability to receive and transmit a new data value twice during each complete cycle of the states of the control, rather than only once as has previously been taught.

It has been usual in the past to think of the voltage level, or the current level in a wire as indicative of the data value carried. However, in the control wires 62a and 62b (FIG. 1) and 64a and 64b, which carry the data-ready and acknowledgement signals, the actual voltage level is not important. Rather, only changes in the level, called edges or transitions, are important. Any change in the voltage level, either from "low" to "high" or from "high" to "low" is a transition. The use of two data units, each with its own row of data cells, connected to control elements in different ways, makes it possible for the instant invention to make good use of both the "high" to "low" and the "low" to "high" transitions, and therefore to operate at about twice the speed that has previously been taught for conventional technology.

Because previous FIFO designs have been sensitive to the logical levels of their input signals rather than to transitions in level, they have required a full cycle of the data input ready signal for each new data element accepted. This full cycle, consisting both of a change from "low" to "high" and of a change from "high" back to "low" again, has taken twice as long as the mechanism illustrated in the instant FIFO. Because the instant FIFO can accept a new input datum for every transition of the input control lines, whether from "low" to "high" or from "high" to "low", rather than for each cycle of their operation, which requires two transitions, the FIFO described here can potentially operate nearly twice as fast as previously known designs.

Whenever the FIFO is able to accept data input, the control signals at wires 62a and 62b of FIG. 1 will be in the same state. The FIFO can become full when the sending device makes a transition of input thereby signaling the wire 62a. The FIFO will indicate that it cannot accept further data by failing to make a corresponding transition in response line or wire 62b. The full condition, therefore, is observable whenever lines 62a and 62b remain in opposite states. After each data value is put into the FIFO, it will appear to be full for a short time until it responds to the change on wire 62b with a corresponding change on wire 62a.

Similarly, whenever the FIFO has data ready for output, it will cause the state of output signaling line 64a to differ from the state of line 64b. The FIFO can become empty when the receiving device makes some transition in the signaling line 64b at the output end of the FIFO. The FIFO will indicate that it has no further data to deliver by failing to make a corresponding transition on line 64a. The empty condition, therefore, is observable whenever lines 64a and 64b are in the same states. After each data value is taken from the FIFO, it will appear to be empty for a short time until it responds to the change on line 64a with a corresponding change on line 64b.

Additional alternative FIFO configurations are considered as follows. As indicated above, the FIFO embodiments described here can be connected together in various ways. One interesting connection is a series-parallel-series FIFO illustrated in FIG. 12. Such a FIFO is capable of storing some $64 \times 64 = 4096$ data values of a single data bit each, but it must be recognized that similar FIFOs of larger or smaller size and for multiple bit data values are possible.

Figure 12:
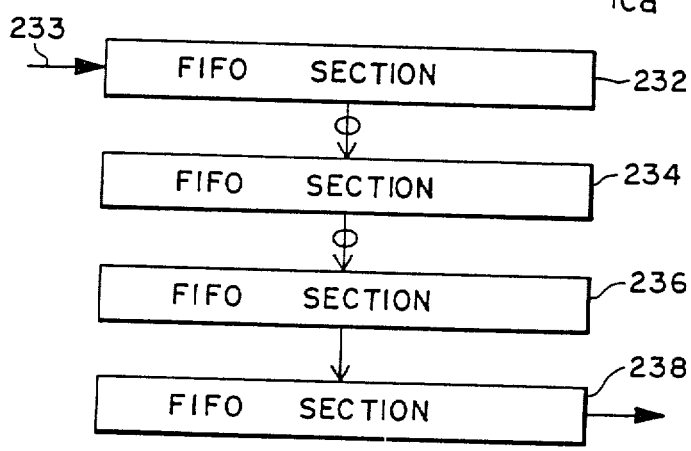
FIG. 12 is a block diagram showing another embodiment of the present invention compounding plural embodiments of FIG. 1.

In the FIFO of FIG. 12, four FIFO's (FIG. 1) have been connected together. The upper one, 232, is a one-bit wide FIFO built according to the teachings herein to accept as input the one bit data values presented on input 233. Of course, the input 233 follows the protocol previously described. The first FIFO 232 is capable of storing 64 bits of data in sequence.

A second part of the system of FIG. 12 consists of two FIFO's 234 and 236 also built according to the teaching herein and connected together in sequence. The two FIFOs 234 and 236 are capable of storing data values of 64 bits each, and together can store 62 data values of 64 bits each. When the first FIFO 232 is full, it passes a data value of 64 bits to the second FIFO 234 simultaneously and in parallel. The second FIFO 234, in turn, passes similar data values of 64 bits to the third FIFO 236, which is again 64 bits wide. The third FIFO 236 passes 64 bit data values into the fourth and last FIFO 238, for series movement, which in turn delivers the one bit data values to the output. Thus, a series-parallel configuration is provided.

Because the data values pass in series through the first FIFO 232, in parallel through the center part (FIFOs 234 and 236) of the system, and in series again through the last FIFO 238, such a system is called a series-parallel-series FIFO or SPS FIFO.

The series FIFOs 232 and 238 must be slightly different than the linear FIFOs heretofore described (FIG. 1). When the first FIFO 232 is full, it generates a control signal to the input end of the control unit of the second FIFO 234 according to the protocol previously described. When the second FIFO 234 has accepted the 64 bits thus delivered, the first FIFO 232 must become empty. Similarly, the fourth FIFO 238 must respond to the control output signals of the third FIFO 236 by accepting a full 64 bit data value. It must thereupon become full and subsequently deliver the 64 bits in sequence to the output wire 39.

There are several ways to construct the first and fourth FIFOs 232 and 238 to have the requisite properties. One is simply to provide two separate control systems for each FIFO, and alternate between them. Other means, such as a special mechanism to set all of the control elements into an empty state will, of course, occur to those familiar with the art.

An advantage of the series-parallel-series (SPS) asynchronous FIFO, illustrated in FIG. 12, is its reduced latency. Consider a linear FIFO 4096 bits in length. Its latency will be the delay inherent in 4096 data cells or control elements. The corresponding SPS FIFO, on the other hand, will have a first FIFO 64 bits long, a second and third FIFO each 64 bits wide and 31 bits long each, and a fourth FIFO 64 bits long. Each data bit traveling through this SPS FIFO will travel through a part of the first FIFO, down the length of the second and third FIFO's, and through a part of the third FIFO, traveling through 64+64=128 data cells in all. Thus the latency of the SPS FIFO is only the delay inherent in 128 data cells or control elements instead of 4096.

In general, a square arrangement of the SPS FIFO will provide the shortest latency and will provide a latency roughly equal to twice the square root of the latency of a linear FIFO of equal length. It is also possible, of course, to compound the SPS idea, so as to reduce the latency to three times the cube root of the latency of a linear FIFO, but such mechanisms require wiring in three dimensions and are thus not often useful.

Another advantage of the SPS FIFO over the corresponding linear FIFO is its reduced power consumption. Not only are there fewer control elements in an SPS FIFO, but also many of them operate at a lower repetition rate. The cells in the second and third FIFO 234 and 236 in FIG. 12, for example, need operate only at 1/64 of the repetition rate that would otherwise be required. In logic families such as CMOS, where energy consumption is closely related to the number of transitions made, such an arrangement provides strikingly reduced power consumption.

The FIFO system disclosed herein can be used to process data passing through the FIFO. In order to do so, each data cell such as data cells 12, 14, 16, 18 of FIG. 1, must include logic circuits that process the data as desired. The processing elements in different data cells need not perform the same function. For example, one logic circuit might increment a data value, another might add two data values together, and so on. But the form of the data cell with processing capability will be the same independent of the actual type of processing accomplished.

Figure 13:
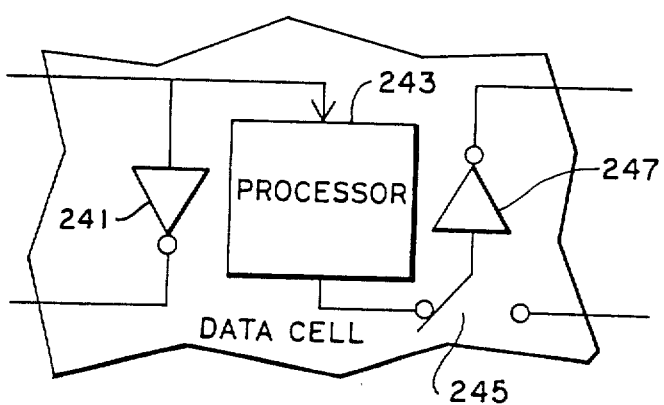
FIG. 13 is a block diagram of an alternative data cell for use in a system as explained with reference to FIG. 1.

A form of processing system is shown in FIG. 13 illustrating the equipment for processing data elements only a single bit wide. It must be recognized that a set of circuits such as shown in FIG. 13 will operate in parallel to perform functions on data elements of many bits. The left inverter 241 in FIG. 13 (which represents the many inverters at the input side of a processing data cell for multiple bit data elements) serves to drive the retrograde data path and the input to the processor 243. The processor 243 receives multiple input bits from the left inverters, as inverter 241 and performs some logic function on them without storage. The output of the processor 243 feeds one side of the switch 245 whose role is similar to that of switch 52 in FIG. 9. The right-hand inverter 247 in FIG. 13 serves a role identical to that of inverter 50 in FIG. 9. A unit, as illustrated in FIG. 13, can serve as any of the data cells in the system of FIG. 1.

Figure 14:
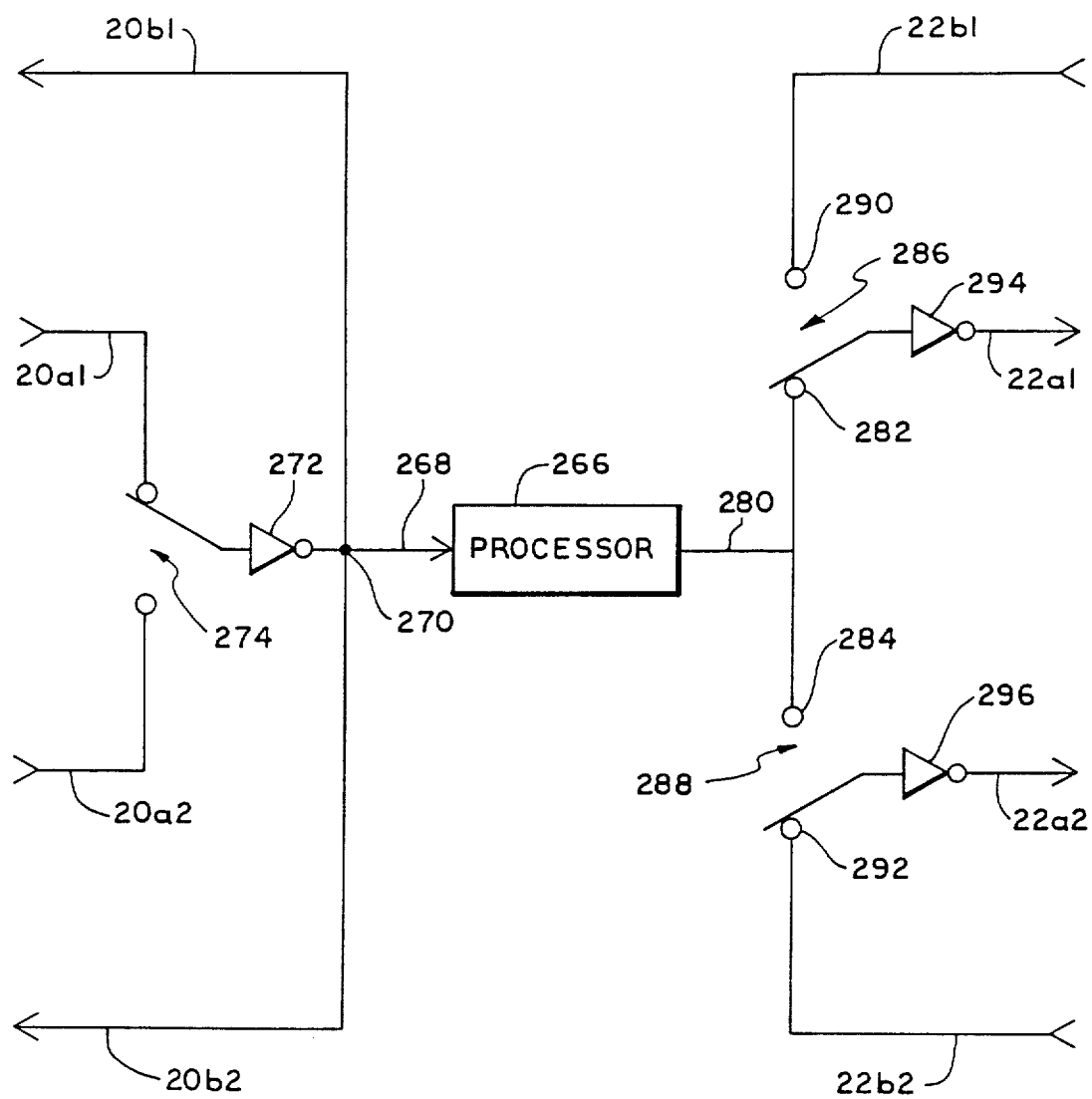
FIG. 14 is a block diagram illustrative of certain processor interconnections in accordance with the present invention.

Notice that in complex FIFOs (FIGS. 4 and 5) of the type described here, each control element drives two data cells. In many cases the processor of FIG. 13 may consist of a great deal of logic, to perform an addition, for example. In such systems it may be desirable to share the processor logic between the two data cells driven by a single common control element. A circuit capable of doing this is shown in FIG. 14. That is, the circuit of FIG. 14 can replace two data cells of the type shown in FIGURE 13.

In FIG. 14, the processor logic 266 receives its input along line 268 from the output of inverter 272 at a junction 270. Inverter 272 receives its input from a two-position switch 274 whose inputs come respectively from upper and lower forward data paths 20a1 and 20a2. The output of inverter 272 also drives the two retrograde output paths 20b1 and 20b2 as can be seen at the left of the drawing. The numbering of the data input paths and retrograde output paths is intended to match the numbering of the inputs to data cell 14 of FIG. 1, in which position one can think of using the circuit of FIG. 14. Because FIG. 14 represents two data cells, the designations 1 and 2 have been appended to the designations 20a and 20b to indicate the two separate data paths involved.

Turning now to the output of the processing element 266 in FIG. 14, it generally progresses to the right, feeding output driving inverters 294 and 296 via the switches 286 and 288 respectively. Output inverters 294 and 296 drive the forward outputs 22a1 and 22a2 respectively. Again the numbering of these outputs matches the output path of data cell 14 in FIG. 1 with the designations 1 and 2 appended to denote the separate data cells involved. Retrograde inputs 22b1 and 22b2 shown at the right of FIG. 14 can also provide inputs to inverters 294 and 296 via the switches 286 and 288.

Operation of the three switches 274, 286 and 288 in FIG. 14 deserves special consideration. These three switches are shown in the condition they will occupy when the associated control element for this data cell is in one of its two states. When the control element changes to the other state, all three of these switches will change to the opposite position. Thus, where the elementary data processing cell of FIG. 13 had a single switch, and a pair of them will have two switches, the circuit of FIG. 14 requires three switches. By including three switches, the logic involved in the processor can be shared; only one such set of logic is required, where two copies of the circuit of FIG. 13 would require two such processors.

Again it must be recognized that the circuit of FIG. 14 is intended to represent one bit of data paths that will ordinarily be many bits wide. Thus the input inverter 272, for example, actually represents several inverters, one for each of the input data bits. The processor unit, naturally, can have many bits of input. It can also have many output bits because the drawing of FIG. 14 is intended to exemplify the data path required for a single bit. Thus the output inverter 294 in FIG. 14 is representative of a set of output inverters, one for each bit in the output word. There is no requirement that the number of input and the number of output bits need match. In fact, in most useful systems they will not match. For example, if the processor performs the addition of two eight-bit numbers to generate a nine-bit sum, there will be sixteen input bits, and thus sixteen inverters 272 but only nine output bits, and thus only nine inverters 294.

From the above exemplary embodiments and detailed descriptions it will be appreciated that effective developments are represented in the computer field. These concepts, techniques and systems have widespread application and to those skilled in the art, numerous modifications and alternative systems will be suggested. Accordingly, the scope hereof is deemed to be as defined by the following claims.

What is claimed is:

1. An apparatus for use with data signals as one of a plurality of like units in a sequence, as in a first-in-first-out register, said one of a plurality of like units for connection with a predecessor unit and a successor unit, said apparatus comprising:
   means for registering a state to provide a control signal for said one unit;
   means controlled by said predecessor and successor units for altering said registered state of said one unit to that of said predecessor unit upon detecting the state of said predecessor unit and said successor unit to be different;
   data means for said one unit for providing a data signal to said predecessor and successor units; and
   switch means for said data means for said one unit activated in accordance with said control signal of said one unit, selectively provide forward and retrograde data paths to said successor and predecessor units whereby to pass a said data signal and enable virtual storage between said one unit and said other of said plurality of like units.

2. An apparatus according to claim 1 wherein said switch means is symmetrical to accommodate forward and retrograde data paths.

3. An apparatus according to claim 2 wherein said means for registering a state comprises a binary device.

4. An apparatus according to claim 1 wherein said means for registering and said means for altering comprise electronic apparatus operating with electrical signals.

5. An apparatus according to claim 4 wherein said switch means is symmetrical to accommodate forward and retrograde data paths.

6. An apparatus according to claim 2 wherein said switch means includes an amplifier means enhancing signals in said data paths.

7. A plurality of apparatus in accordance with claim 6 wherein said means to provide a control signal for said one unit is coupled to the means for providing a control signal in said predecessor and successor units and wherein said switch means of said plural units are interconnected to provide a first-in-first-out registration capability.

8. An apparatus according to claim 1 wherein said means for altering said registered state is asynchronous.

9. An apparatus according to claim 8 wherein said switch means is symmetrical to accommodate forward and retrograde data paths.

10. An apparatus according to claim 9 wherein said switch means includes an amplifier means for enhancing signals passing through said data paths.

11. An apparatus according to claim 10 wherein said switch means is asynchronous.

12. An apparatus in the form of said one unit according to claim 1 further including a processor for said one unit coupled to said switch means to process data in a forward data path.

13. A plurality of apparatus in accordance with claim 11 wherein said means to provide a control signal for said one unit is coupled to similar control means in said predecessor and successor units and wherein said switch means of said plurality units are interconnected to provide a first-in-first-out registration capability.

14. An apparatus according to claim 13 wherein said means for registering a state to provide control signals and said switch means are sized progressively in said plurality of units to accommodate varying signal levels in said apparatus.

15. An apparatus according to claim 13 wherein each of said means for registering and said means to provide a control signal comprise electronic apparatus operating with electrical signals.

16. An apparatus according to claim 1 further including multiple switch means in said unit actuated in accordance with said control signal.

17. An apparatus according to claim 16 further including processor means coupled between said switch means of said one unit and a predecessor unit process data in a data path therebetween.

18. A first-in-first-out register system for storing received data and having an input and an output, comprising:
   a plurality of amplifying data cells including at least three cells;
   means for interconnecting said amplifying data cells in a sequence between said input and said output including switch means to pass data signals bidirectionally with reference to said input and output and whereby said amplifying data cells may be controlled to pass data toward said output or pass data toward said input thereby provide cooperative storage of data between two amplifying data cells; and control means for setting said switch means to control said amplifying data cells in accordance with received data signals and a predetermined propagation pattern whereby to provide such data signals at said output.

19. A system according to claim 18 wherein said means for interconnecting said data cells passes data signals asynchronously in said sequence of data cells.

20. A system according to claim 18 wherein said data cells manifest data moving in said sequence by signal transitions.

21. A system according to claim 19 wherein said data cells are connected to said control means to receive binary complementary signals from said control means.

22. A system according to claim 21 comprising plural sequences of said data cells, said data cells of different sequences being controlled by said control means.

23. A compound system comprising a plurality of systems in accordance with claim 18 interconnected in a series-parallel-series configuration.

24. A first-in-first-out register for storing data represented by received data signals, comprising:
a plurality of amplifiers designated in a predetermined progressive sequence;
input means to said plurality of amplifiers in said sequence;
a plurality of switch means individually interconnecting said amplifiers in said sequence with adjacent of said amplifiers in said sequence whereby signals from said sequence and whereby pairs of said amplifiers are switched to establish a storage therebetween; and
control means for setting said switch means in accordance with received data signals and a propagation pattern in said register.

* * * * *

UNITED STATES PATENT AND TRADEMARK OFFICE
CERTIFICATE OF CORRECTION

PATENT NO. : 4,837,740

DATED : June 6, 1989

INVENTOR(S) : Ivan E. Sutherland

It is certified that error appears in the above-identified patent and that said Letters Patent is hereby corrected as shown below:

| Column | Line | |
|---|---|---|
| Title Page | [76] | "Ivan F." should be --Ivan E.--; |
| 5 | 12 | "7B" should be --7F--; |
| 5 | 27 | "PREPARED" should be --PREFERRED--; |
| 10 | 40 | after "For", delete the comma; |
| 10 | 59 | after "(FIG. 3A)", insert a period; |
| 12 | 4 | delete the hyphen and insert a space between "the-data"; |
| 17 | 57 | after "FIG.", delete "6" and insert --4 and the state explanations of FIG. 6--; |
| 23 | 61 | after "selectively" insert --to--; |
| 24 | 11 | after "amplifier means" insert --for--; |
| 24 | 55 | after "predecessor unit" insert --to--; |
| 26 | 13 | after "from said" insert --amplifiers can be switched to pass forward or backward in said--. |

Signed and Sealed this

Tenth Day of April, 1990

Attest:

HARRY F. MANBECK, JR.

Attesting Officer

Commissioner of Patents and Trademarks